US008667362B2

(12) United States Patent
Currivan et al.

(10) Patent No.: US 8,667,362 B2
(45) Date of Patent: Mar. 4, 2014

(54) SYSTEM AND METHOD FOR MITIGATING BURST NOISE IN A COMMUNICATIONS SYSTEM

(75) Inventors: Bruce J. Currivan, Dove Canyon, CA (US); Thomas J. Kolze, Phoenix, AZ (US); Daniel H. Howard, Atlanta, GA (US); Thomas J. Quigley, Franklin, NC (US); Nambi Seshadri, Irvine, CA (US); Thomas L. Johnson, Gainesville, GA (US); Scott Cummings, Suwanee, GA (US); James Harrell, Atlanta, GA (US); Fred Bunn, Roswell, GA (US); Joel Danzig, Alpharetta, GA (US); Stephen Hughey, Sugar Hill, GA (US)

(73) Assignee: Broadcom Corporation, Irvine, CA (US)

( * ) Notice: Subject to any disclaimer, the term of this patent is extended or adjusted under 35 U.S.C. 154(b) by 1251 days.

(21) Appl. No.: 12/488,124

(22) Filed: Jun. 19, 2009

(65) Prior Publication Data

US 2009/0327845 A1 Dec. 31, 2009

Related U.S. Application Data

(63) Continuation of application No. 10/175,330, filed on Jun. 20, 2002, now Pat. No. 7,631,242.

(60) Provisional application No. 60/299,768, filed on Jun. 22, 2001, provisional application No. 60/308,101, filed on Jul. 30, 2001.

(51) Int. Cl.
*H03M 13/00* (2006.01)

(52) U.S. Cl.
USPC .......................................... 714/755; 714/776

(58) Field of Classification Search
USPC .................................................. 714/755, 776
See application file for complete search history.

(56) References Cited

U.S. PATENT DOCUMENTS

| 4,491,943 A | * | 1/1985 | Iga et al. ........................ 370/511 |
| 4,660,202 A | | 4/1987 | Woodsum |

(Continued)

FOREIGN PATENT DOCUMENTS

| GB | 2216752 A | 10/1989 |
| WO | WO 9802987 A1 | 1/1998 |

OTHER PUBLICATIONS

Frank et al., "Tradeoffs in Concatenated Coding for Frequency-Hop Packet Radio with Partial-Band Interference", IEEE Military Communications Conference, Oct. 11-14, 1992, pp. 125-129 vol. 1.

(Continued)

*Primary Examiner* — Fritz Alphonse
(74) *Attorney, Agent, or Firm* — Sterne, Kessler, Goldstein & Fox PLLC

(57) ABSTRACT

A system, method and computer program product is provided for mitigating the effects of burst noise on packets transmitted in a communications system. A transmitting device applies an outer code, which may include, for example, a block code, an exclusive OR (XOR) code, or a repetition code, to one or more packets prior to adaptation of the packets for transmission over the physical (PHY) layer of the communications system, wherein the PHY layer adaptation may include FEC encoding of individual packets. The outer coded packets are then separately transmitted over a channel of the communications system. A receiving device receives the outer coded packets, performs PHY level demodulation and optional FEC decoding of the packets, and then applies outer code decoding to the outer coded packets in order to restore packets that were erased during transmission due to burst noise or other impairments on the channel.

54 Claims, 18 Drawing Sheets

(56) References Cited

U.S. PATENT DOCUMENTS

| | | | |
|---|---|---|---|
| 4,718,066 A * | 1/1988 | Rogard | 714/751 |
| 4,888,767 A | 12/1989 | Furuya et al. | |
| 5,115,436 A * | 5/1992 | McAuley | 714/781 |
| 5,159,452 A * | 10/1992 | Kinoshita et al. | 348/466 |
| 5,345,594 A * | 9/1994 | Tsuda | 455/18 |
| 5,432,787 A * | 7/1995 | Chethik | 370/473 |
| 5,432,800 A * | 7/1995 | Kuroda et al. | 714/758 |
| 5,600,663 A | 2/1997 | Ayanoglu et al. | |
| 5,617,541 A * | 4/1997 | Albanese et al. | 709/207 |
| 5,642,365 A * | 6/1997 | Murakami et al. | 714/761 |
| 5,677,918 A * | 10/1997 | Tran et al. | 714/748 |
| 5,740,518 A | 4/1998 | Takashima et al. | |
| 5,802,311 A | 9/1998 | Wronski | |
| 5,841,776 A * | 11/1998 | Chen | 370/441 |
| 5,842,010 A | 11/1998 | Jain et al. | |
| 5,844,918 A * | 12/1998 | Kato | 714/751 |
| 5,905,741 A * | 5/1999 | Matsukuma et al. | 714/758 |
| 5,907,563 A * | 5/1999 | Takeuchi et al. | 714/751 |
| 5,973,625 A | 10/1999 | Nam | |
| 6,000,053 A * | 12/1999 | Levine et al. | 714/766 |
| 6,012,159 A * | 1/2000 | Fischer et al. | 714/755 |
| 6,052,819 A | 4/2000 | Barker et al. | |
| 6,061,820 A | 5/2000 | Nakakita et al. | |
| 6,081,907 A * | 6/2000 | Witty et al. | 714/6.1 |
| 6,101,625 A | 8/2000 | Higashi | |
| 6,141,788 A * | 10/2000 | Rosenberg et al. | 714/774 |
| 6,145,109 A * | 11/2000 | Schuster et al. | 714/752 |
| 6,216,250 B1 * | 4/2001 | Williams | 714/799 |
| 6,263,466 B1 | 7/2001 | Hinedi et al. | |
| 6,272,658 B1 * | 8/2001 | Steele et al. | 714/752 |
| 6,285,681 B1 | 9/2001 | Kolze et al. | |
| 6,289,000 B1 | 9/2001 | Yonge, III | |
| 6,289,054 B1 * | 9/2001 | Rhee | 375/240.27 |
| 6,289,485 B1 * | 9/2001 | Shiomoto | 714/779 |
| 6,308,294 B1 * | 10/2001 | Ghosh et al. | 714/751 |
| 6,317,462 B1 | 11/2001 | Boyce | |
| 6,370,669 B1 | 4/2002 | Eroz et al. | |
| 6,397,368 B1 | 5/2002 | Yonge, III et al. | |
| 6,408,000 B1 * | 6/2002 | Lamberg et al. | 370/390 |
| 6,421,357 B1 | 7/2002 | Hall | |
| 6,421,387 B1 | 7/2002 | Rhee | |
| 6,421,803 B1 | 7/2002 | Persson et al. | |
| 6,430,193 B1 * | 8/2002 | Raissinia et al. | 370/448 |
| 6,430,233 B1 | 8/2002 | Dillon et al. | |
| 6,445,717 B1 * | 9/2002 | Gibson et al. | 370/473 |
| 6,473,875 B1 * | 10/2002 | Anderson | 714/746 |
| 6,477,669 B1 * | 11/2002 | Agarwal et al. | 714/708 |
| 6,477,678 B1 | 11/2002 | Fang et al. | |
| 6,487,690 B1 | 11/2002 | Schuster et al. | |
| 6,490,705 B1 * | 12/2002 | Boyce | 714/776 |
| 6,496,520 B1 * | 12/2002 | Acosta | 370/474 |
| 6,553,538 B2 * | 4/2003 | Zehavi | 714/784 |
| 6,601,208 B2 | 7/2003 | Wu | |
| 6,650,624 B1 | 11/2003 | Quigley et al. | |
| 6,654,384 B1 | 11/2003 | Reza et al. | |
| 6,678,856 B1 | 1/2004 | Jordan et al. | |
| 6,728,920 B1 | 4/2004 | Ebersman | |
| 6,771,674 B1 | 8/2004 | Schuster et al. | |
| 7,089,478 B2 | 8/2006 | Cummings et al. | |
| 7,151,754 B1 | 12/2006 | Boyce et al. | |
| 7,274,679 B2 | 9/2007 | Amit et al. | |
| 7,343,540 B2 | 3/2008 | Khermosh et al. | |
| 7,631,242 B2 | 12/2009 | Currivan et al. | |
| 7,765,577 B2 * | 7/2010 | Bhaskaran et al. | 725/131 |
| 8,301,967 B2 * | 10/2012 | Bhaskaran et al. | 714/755 |
| 2002/0029362 A1 | 3/2002 | Stephen et al. | |
| 2002/0053049 A1 | 5/2002 | Shiomoto et al. | |
| 2002/0167962 A1 | 11/2002 | Kowalski | |
| 2003/0031198 A1 | 2/2003 | Currivan et al. | |

OTHER PUBLICATIONS

International Search Report for PCT/US02/20015, dated Dec. 16, 2002, issued by ISA/US.

Mortimer, B., et al., "The Design of a High-Performance Error-Correcting Coding Scheme for the Canadian Broadcast Telidon System Based on Reed-Solomon Codes", IEEE Trans. on Communications, vol. COM-35, No. 11, Nov. 1987, pp. 1113-1123.

Oguz, N., et al., "Performance Analysis of Two-Level Forward Error Correction for Lost Cell Recovery in ATM Networks", INFOCOM '95, 1995, pp. 728-737.

Sherwood, P., et al., "Error Protection for Progressive Image Transmission Over Memoryless and Fading Channels", Eee Trans. On Communications, vol. 46, No. 12, Dec. 1998, pp. 1555-1559.

European Search Report for Appln. No. EP 02780886.4, mailed Mar. 22, 2010, 3 pages.

* cited by examiner

SYSTEM AND METHOD FOR MITIGATING BURST NOISE IN A COMMUNICATIONS SYSTEM

CROSS-REFERENCE TO RELATED APPLICATIONS

This application is a continuation of U.S. application Ser. No. 10/175,330, entitled "System, Method and Computer Program Product for Mitigating Burst Noise in a Communications System," filed Jun. 20, 2002, now U.S. Pat. No. 7,631,242, which claims priority to the following provisional applications: U.S. Application Ser. No. 60/299,768, entitled "Method, System and Computer Program Product for Mitigating Burst Noise," filed Jun. 22, 2001, and U.S. Application Ser. No. 60/308,101, entitled "FEC Block Reconstruction Method, System and Computer Program Product for Mitigating Burst Noise," filed Jul. 30, 2001. Each of these applications is incorporated by reference in their entirety as if set forth fully herein.

This application is related to non-provisional application entitled "FEC Block Reconstruction System, Method and Computer Program Product for Mitigating Burst Noise in a Communications System," application Ser. No. 10/175,346, filed Jun. 20, 2002, now U.S. Pat. No. 7,089,478, which is incorporated by reference in its entirety.

BACKGROUND OF THE INVENTION

1. Field of the Invention

The present invention relates generally to the field of communications systems. More specifically, the present invention relates to communication systems in which electronic information is transmitted in packets.

2. Background

Communications systems may be subject to intermittent, random bursts of noise, often referred to as burst noise or impulse noise. This burst noise can result in the introduction of errors into the electronic information transmitted over the communications system. For example, in a communications system in which voice, data and/or other electronic information is transmitted in packets, the presence of burst noise can cause packets to become corrupted. Packet errors must be detected in order for a communications system to operate reliably. Where packet errors are detected but cannot be corrected, bad packets must be dropped and re-transmitted, resulting in a net loss of transmission speed and network bandwidth. If the dropped packets include voice information, the result may be a loss in overall quality of service (QOS).

Some communications systems utilize Forward Error Correction (FEC) and/or interleaving in order to control errors in transmitted data resulting from burst noise. FEC involves the addition of extra information to data before it is transmitted, which is then used by the receiver to detect errors and correct the data when necessary. Depending on the FEC algorithm used, the receiver can detect and correct fewer than a predetermined number of errors per packet. Different types of FEC methods include block codes, cyclic codes, Reed-Solomon codes, and convolutional codes. Interleaving involves rearranging data to be transmitted according to a mapping and then returning the data to its original order at the receiver. Interleaving serves to spread the effects of burst noise over multiple packets, thereby decreasing the average number of errors per packet. This, in turn, enhances the ability of FEC to detect and correct errors.

For example, in a conventional cable modem system operating in accordance with DOCSIS (Data Over Cable System Interface Specification), the upstream physical (PHY) layer utilizes a combination of Reed-Solomon coding and interleaving to control errors. These methods allow an upstream receiver to correct errors resulting from burst noise of a certain duration and frequency of occurrence. However, there may be extreme cases where the burst noise is so severe that more errors are introduced into a packet than these combined methods can detect and correct. In these instances, packets will be lost. Therefore, what is needed is a technique for detecting and correcting packet errors in cases where burst noise is more severe than can be handled by conventional PHY technology.

BRIEF SUMMARY OF THE INVENTION

The present invention addresses the above problems by providing novel techniques for preventing the loss of packets due to burst noise in a communications system. In accordance with embodiments of the invention, a transmitting device applies a layer of coding, which may be termed an "outer code," to one or more packets prior to transmitting the packets over a communication channel. The outer coding of the packets enables a receiving device to restore packets corrupted by burst noise in instances where the packet errors could not otherwise be corrected by conventional PHY layer Forward Error Correction (FEC) and interleaving techniques.

In a communications system in which data is transmitted in bursts, a severe impairment on the communication channel can cause an entire burst of data to be lost. One way to combat the impairment is to increase the robustness of an individual burst; for example, the amount of parity information in the burst may be substantially increased. However, this approach will negatively impact the data transmission efficiency of the communications system. Moreover, if the impairment is severe enough, the burst may be lost regardless of the increased level of error correction. In contrast, the outer coding techniques of the present invention increase robustness through the transmission of additional bursts (e.g., block-encoded parity packets, repeated packets, or re-transmitted packets), such that burst data may be recovered even in the instance where an entire burst has been lost due to an impairment on the communication channel.

Typically, a first aspect of a burst communication system operates to ensure successful transmission of individual bursts of data over the communication channel, while a second aspect assembles data bursts into a stream of data for processing by a higher-level application. Embodiments of the present invention may be advantageously implemented in conjunction with this second aspect to perform outer encoding and decoding. In a DOCSIS system, the first aspect corresponds to the PHY layer, while the second aspect corresponds to the MAC layer. Accordingly, the outer coding and decoding of packets may occur at the MAC layer of the transmitting and receiving devices, which resides just above the PHY layer. For example, the PHY layer of a receiving device may be unable to correct packets which are in error due to burst noise. In accordance with embodiments of the present invention, these packets are further processed by an outer code at the MAC layer in order to correct the bad packets.

In an embodiment of the invention the outer code comprises a block code, such as an (8, 4) Hamming code or an XOR code. A transmitting device applies the block code to one or more packets to generate a plurality of information segments and parity segments, each of which is then transmitted separately over a communication channel to a receiving device. A receiving device receives and collects the information and parity segments and decodes them in accordance with the same block code in order to restore any segments that were lost during transmission.

In an alternate embodiment of the invention, the outer code is a repetition code in which the same packet is transmitted two or more times from a transmitting device to a receiving device. Provided at least one of the repeated packets survives transmission, the receiving device can recover the original packet.

In another embodiment of the invention, a retransmission technique is used to mitigate the effects of burst noise on the communication channel. In accordance with this technique, a receiving device instructs a transmitting device to retransmit a packet which has been lost due to noise on the communication channel. Methods for implementing this technique include sending data acknowledgment messages (ACKs) from the receiving device to the transmitting device every time a packet is received successfully, or by sending data non-acknowledgment messages (NACKs) from the receiving device to the transmitting device when a bad packet is received.

In a further embodiment of the invention, an FEC block reconstruction technique is used by a receiving device to restore transmitted packets that have been corrupted by burst noise. This technique takes advantage of the fact that packets are often transmitted as a plurality of FEC blocks. In accordance with such a technique, a receiving device receives some but not all of the FEC blocks of a transmitted packet. The receiving device then replaces the bad FEC blocks with good FEC blocks from a repeated packet transmission, if repetition outer coding is used, or by requesting retransmission of the bad FEC blocks or the entire original packet from a transmitting device, if a retransmission technique is used. A combination of repetition coding, retransmission, and FEC block reconstruction may also be used.

Embodiments of the present invention provide a means for greatly improving the robustness of a communications system afflicted with occasional, or bursty, extreme impairment levels. A particular advantage of the techniques provided herein is that they may be overlaid, in some cases, onto existing communication systems in the field with only minor upgrade or modification required. For example, embodiments of the present invention may be implemented primarily as a software application running in, or in conjunction with, existing communication devices, such as existing cable modem or cable modem termination system (CMTS) hardware. Thus, embodiments of the present invention provide a solution to a PHY level impairment without actually altering the PHY layer of existing systems.

Embodiments of the present invention may also provide for additional robustness above the PHY layer without having to rely on failure mechanisms from higher layers in the network protocol stack, and with a minimum impact on latency. Implementations of the present invention may have no noticeable impact on latency, unlike some Automatic Repeat Request (ARQ) schemes. Embodiments of the present invention can provide robustness in cases where ARQ is not feasible, such as voice applications. By providing another level of mitigation against PHY layer impairments, especially a severe time-varying impairment, embodiments of the present invention can optimize the conventional PHY layer for a more normal, non-extreme impairment level. Embodiments of the present invention thus provide superior utilization of a communication channel as compared to a modified, traditional PHY-layer-only solution, which must somehow overcome severe impairments by itself. Finally, techniques in accordance with the present invention can be combined with other techniques, such as packet header suppression (PHS) techniques, to beneficially result in increased robustness and efficiency.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the pertinent art to make and use the invention.

Figure 1:
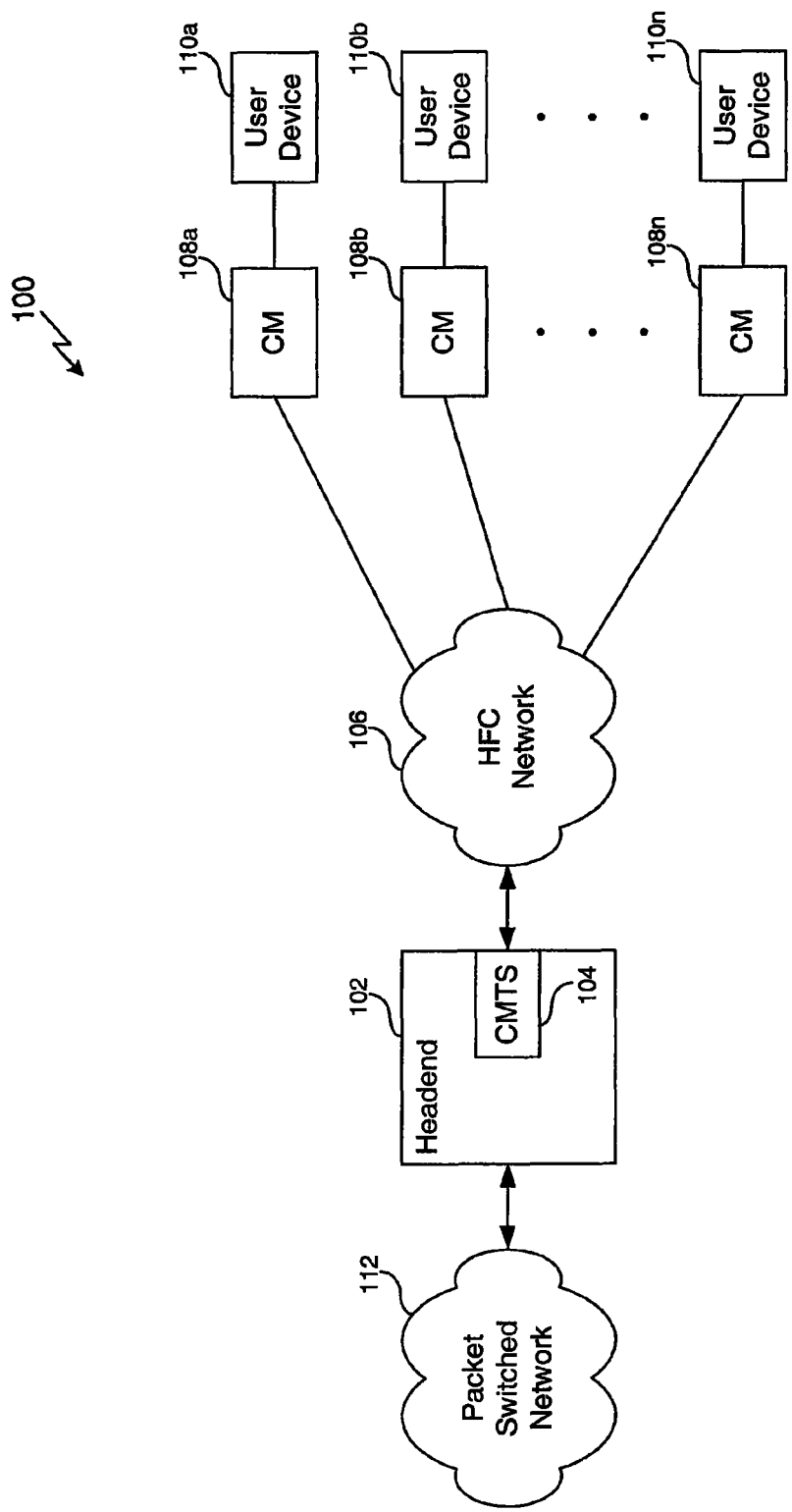
FIG. 1 is a high level block diagram of a cable modem system in which embodiments of the present invention may operate.

The features and advantages of the present invention will become more apparent from the detailed description set forth below when taken in conjunction with the drawings in which like reference characters identify corresponding elements throughout. In the drawings, like reference numbers generally indicate identical, functionally similar, and/or structurally similar elements. The drawings in which an element first appears is indicated by the leftmost digit(s) in the corresponding reference number.

DETAILED DESCRIPTION OF THE INVENTION

Table of Contents

A. Example Cable Modem System
   1. Example Cable Modem Termination System (CMTS)
   2. Example Cable Modem
B. Methods for Mitigating Burst Noise in Accordance with Embodiments of the Present Invention
   1. Outer Block Coding
      a. Hamming Block Coding
      b. Exclusive OR (XOR) Coding
      c. Alternative Outer Block Coding Embodiments
   2. Repetition Coding
   3. Retransmission
   4. FEC Block Reconstruction
      a. FEC Block Reconstruction and Outer Block Coding
      b. FEC Block Reconstruction and Repetition Coding
      c. Alternative FEC Block Reconstruction Embodiments
   5. Outer Coding and Packet Header Suppression
   6. Outer Coding of Downstream Transmissions in a Cable Modem System
   7. Transmission Scheduling
C. Example Software Implementation
D. Conclusion

A. Example Cable Modem System

Although the techniques of the present invention may be practiced in any communications system, example embodiments described herein pertain specifically to cable modem systems. Accordingly, an example cable modem system will be described in more detail below. However, the invention is not limited to cable modem systems. Persons skilled in the art based on the teachings provided herein will appreciate that the present invention may be practiced in any communications system in which information is transmitted in packets. For example, embodiments of the present invention may also be implemented in wireless communication systems that transmit information in packets.

FIG. 1 is a high-level block diagram of an example cable modem system 100 in which embodiments of the present invention may operate. The example cable modem system 100 enables voice communications, video and data services based on a bi-directional transfer of packet-based traffic, such as Internet Protocol (IP) traffic, between a cable system headend 102 and a plurality of cable modems 108a-108n over a hybrid fiber-coaxial (HFC) cable network 106.

The cable headend 102 is comprised of at least one cable modem termination system (CMTS) 104. The CMTS 104 is the portion of the cable headend 102 that manages the upstream and downstream transfer of data between the cable headend 102 and the cable modems 108a-108n, which are located at the customer premises. The CMTS 104 broadcasts information downstream to the cable modems 108a-108n as a continuous transmitted signal in accordance with a time division multiplexing (TDM) technique. Additionally, the CMTS 104 receives data from the cable modems 108a-108n over a plurality of shared upstream channels. Data from the cable modems 108a-108n may be transmitted upstream in accordance with a time domain multiple access (TDMA) technique or a synchronous code division multiple access (S-CDMA) technique. In accordance with TDMA, each cable modem 108a-108n may only send information upstream as short burst signals during a transmission opportunity allocated to it by the CMTS 104.

As shown in FIG. 1, the CMTS 104 further serves as an interface between the HFC network 106 and a packet-switched network 112, transferring IP packets received from the cable modems 108a-108n to the packet-switched network 112 and transferring IP packets received from the packet-switched network 112 to the cable modems 108a-108n when appropriate. The packet-switched network 112 may include, for example, the Internet.

In addition to the CMTS 104, the cable headend 102 may also include one or more Internet routers to facilitate the connection between the CMTS 104 and the packet-switched network 112, as well as one or more servers for performing necessary network management tasks.

The HFC network 106 provides a point-to-multipoint topology for the high-speed, reliable, and secure transport of data between the cable headend 102 and the cable modems 108a-108n at the customer premises. As will be appreciated by persons skilled in the relevant art(s), the HFC network 106 may include coaxial cable, fiberoptic cable, or a combination of coaxial cable and fiberoptic cable linked via one or more fiber nodes.

Each of the cable modems 108a-108n operates as an interface between the HFC network 106 and at least one attached user device. In particular, the cable modems 108a-108n convert downstream signals received over the HFC network 106 into IP data packets for receipt by an attached user device. Additionally, the cable modems 108a-108n convert IP data packets received from the attached user device into upstream burst signals suitable for transfer over the HFC network 106.

In the example cable modem system 100, each cable modem 108a-108n is shown supporting only a single user device for clarity. In general, each cable modem 108a-108n is capable of supporting a plurality of user devices for communication over the cable modem system 100. User devices may include personal computers, data terminal equipment, telephony devices, broadband media players, network-controlled appliances, or any other device capable of transmitting or receiving data over a packet-switched network.

In the example cable modem system 100, cable modems 108a-108n and CMTS 104 represent DOCSIS-compliant cable modem equipment. In other words, cable modems 108a-108n and CMTS 104 communicate in accordance with protocols and formats set forth in the DOCSIS specification. The term DOCSIS (Data Over Cable System Interface Specification) generally refers to a group of specifications published by CableLabs that define industry standards for cable headend and cable modem equipment. In part, DOCSIS sets forth requirements and objectives for various aspects of cable modem systems including operations support systems, management, data interfaces, as well as network layer, data link layer, and physical layer transport for data over cable systems.

1. Example Cable Modem Termination System (CMTS)

Figure 2:
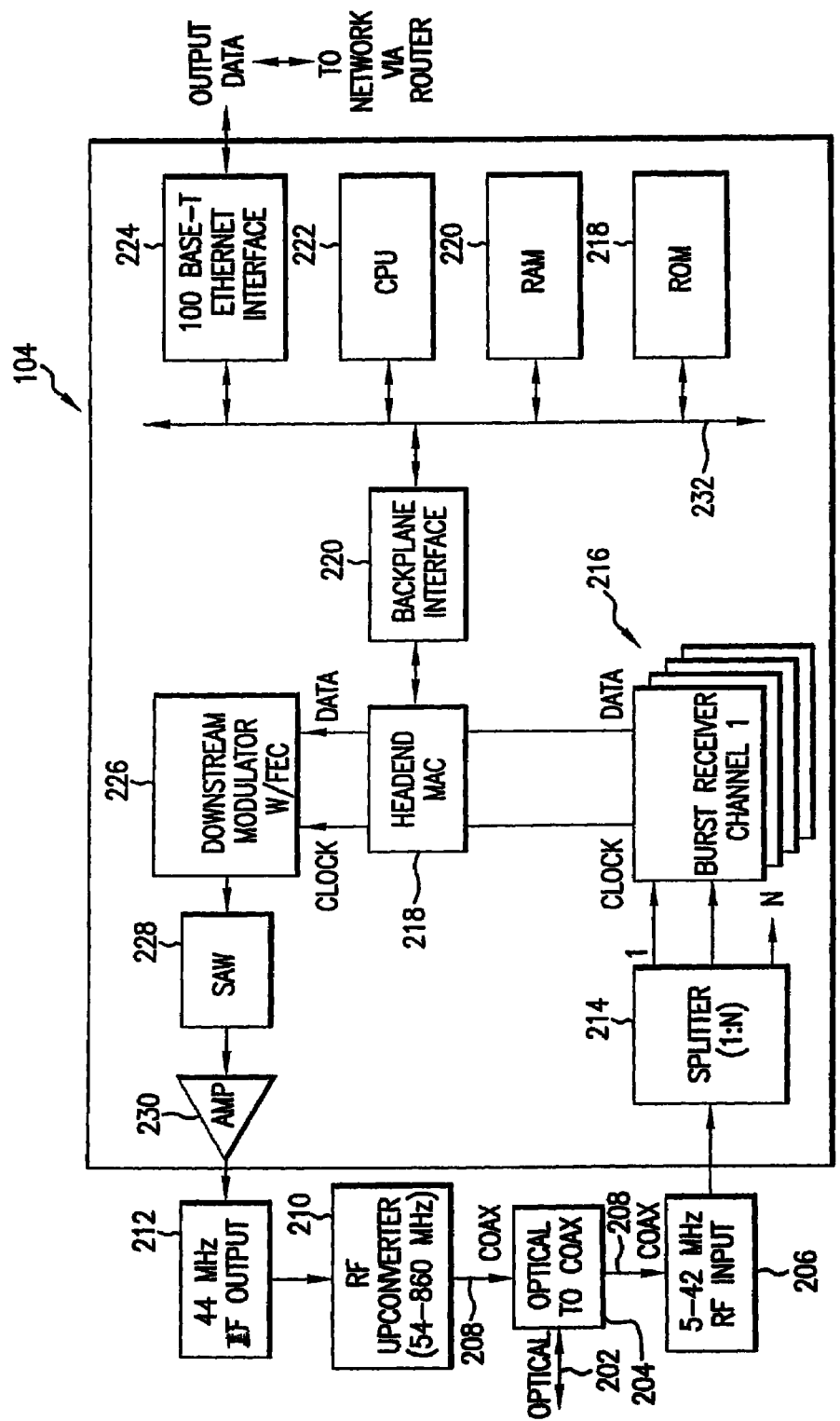
FIG. 2 is a schematic block diagram of an example cable modem termination system (CMTS) in accordance with embodiments of the present invention.

FIG. 2 depicts a schematic block diagram of an implementation of the CMTS 104 of cable modem system 100, which is presented by way of example, and is not intended to limit the present invention. The CMTS 104 is configured to receive and transmit signals to and from the HFC network 106, a portion of which is represented by the optical fiber 202 of FIG. 2. Accordingly, the CMTS 104 will be described in terms of a receiver portion and a transmitter portion.

The receiver portion includes an optical-to-coax stage 204, an RF input 206, a splitter 214, and a plurality of burst receivers 216. Reception begins with the receipt of upstream burst signals originating from one or more cable modems by the optical-to-coax stage 204 via the optical fiber 202. The optical-to-coax stage 204 routes the received burst signals to the radio frequency (RF) input 206 via coaxial cable 208. These upstream burst signals have spectral characteristics within the frequency range of roughly 5-42 MHz.

The received signals are provided by the RF input 206 to the splitter 214 of the CMTS 104, which separates the RF input signals into N separate channels. Each of the N separate channels is then provided to a separate burst receiver 216 which operates to demodulate the received signals on each channel in accordance with a particular demodulation technique to recover the underlying information signals. The demodulation technique may comprise, without limitation, a Quadrature Phase Shift Key (QPSK) technique, an 8-Quadrature Amplitude Modulation (QAM) technique, a 16-QAM technique, a 32-QAM technique, or a 64-QAM technique. Each burst receiver 216 also converts the underlying information signals from an analog form to digital form. This digital data is subsequently provided to the headend media access control (MAC) 218.

The headend MAC 218 operates to process the digital data in accordance with the DOCSIS specification. The functions of the headend MAC 218 may be implemented in hardware or in software. In the example implementation of FIG. 2, the functions of the headend MAC 218 are implemented both in hardware and software. Software functions of the headend MAC 218 may be stored in either the random access memory (RAM) 220 or the read-only memory (ROM) 218 and executed by the CPU 222. The headend MAC is in electrical communication with these elements via a backplane interface 220 and a shared communications medium 232. In embodiments, the shared communications medium 232 may comprise a computer bus or a multiple access data network.

The headend MAC 218 is also in electrical communication with the Ethernet interface 224 via both the backplane interface 220 and the shared communications medium 232. When appropriate, Ethernet packets recovered by the headend MAC 218 are transferred to the Ethernet interface 224 for delivery to the packet-switched network 112 via a router.

The transmitter portion of the CMTS 104 includes a downstream modulator 226, a surface acoustic wave (SAW) filter 228, an amplifier 230, an intermediate frequency (IF) output 212, a radio frequency (RF) upconverter 210 and the optical-to-coax stage 204. Transmission begins with the generation of a digital broadcast signal by the headend MAC 218. The digital broadcast signal may include data originally received from the packet-switched network 112 via the Ethernet interface 224. The headend MAC 218 outputs the digital broadcast signal to the downstream modulator 226 which converts it into an analog form and modulates it onto a carrier signal in accordance with, for example, a 64-QAM or 256-QAM technique.

The modulated carrier signal output by the downstream modulator 226 is input to the SAW filter 228 which passes only spectral components of the signal that are within a desired bandwidth. The filtered signal is then output to an amplifier 230 which amplifies it and outputs it to the IF output 212. The IF output 212 routes the signal to the RF upconverter 210, which upconverts the signal. The upconverted signal has spectral characteristics in the frequency range of approximately 54-860 MHz. The upconverted signal is then output to the optical-to-coax stage 204 over the coaxial cable 208. The optical-to-coax stage 204 broadcasts the signal via the optical fiber 202 of the HFC network 106.

2. Example Cable Modem

Figure 3:
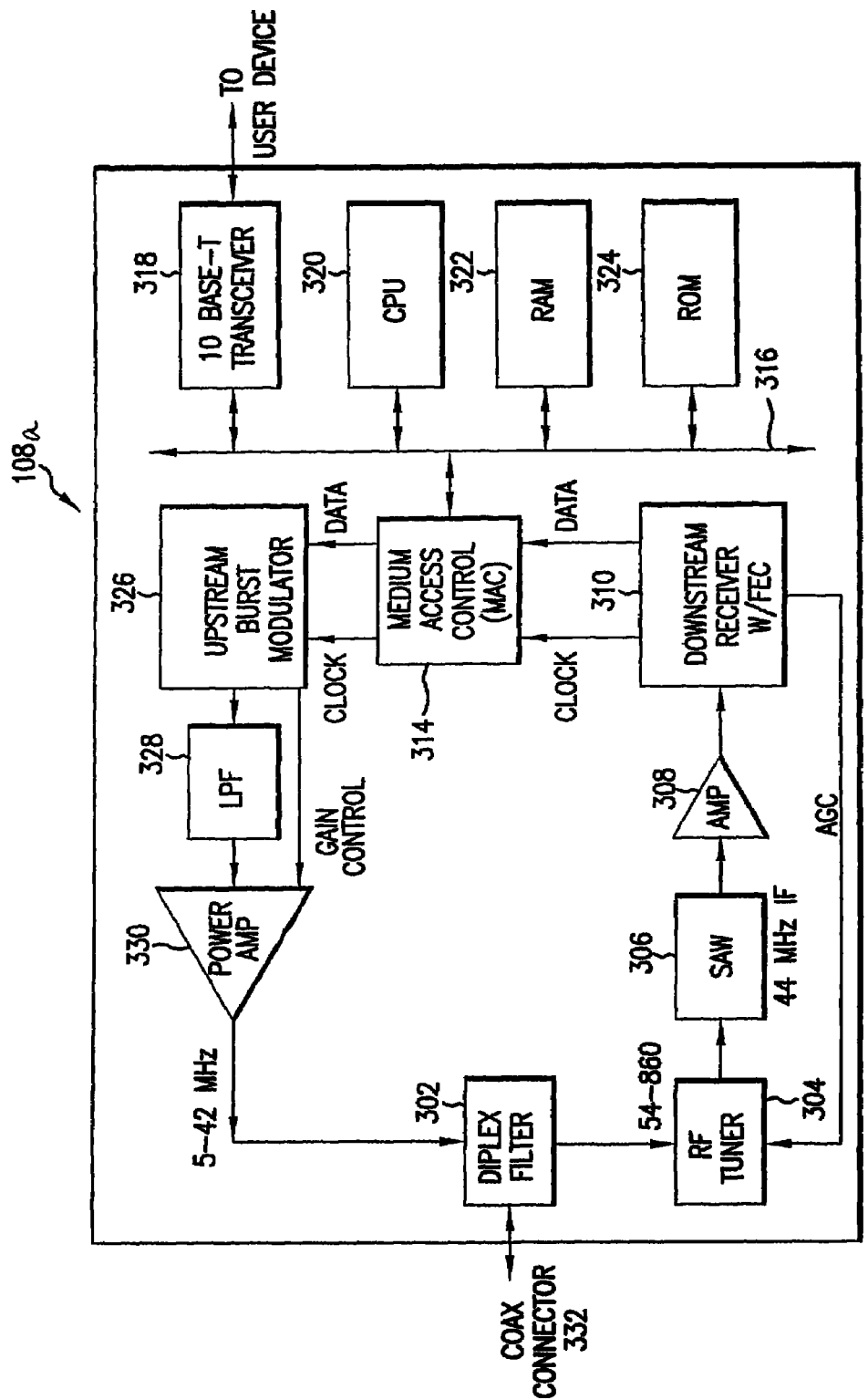
FIG. 3 is a schematic block diagram of an example cable modem in accordance with embodiments of the present invention.

FIG. 3 depicts a schematic block diagram of an implementation of the cable modem 108a of cable modem system 100, which is presented by way of example, and is not intended to limit the present invention. The cable modem 108a is configured to receive and transmit signals to and from the HFC network 106 via the coaxial connector 332 of FIG. 3. Accordingly, the cable modem 108a will be described in terms of a receiver portion and a transmitter portion.

The receiver portion includes a diplex filter 302, an RF tuner 304, a SAW filter 306, an amplifier 308, and a downstream receiver 310. Reception begins with the receipt of a downstream signal originating from the CMTS 104 by the diplex filter 302. The diplex filter 302 operates to isolate the downstream signal and route it to the RF tuner 304. In embodiments, the downstream signal has spectral characteristics in the frequency range of roughly 54-860 MHz. The RF tuner 304 downconverts the signal and outputs it to the SAW filter 306, which passes only spectral components of the downconverted signal that are within a desired bandwidth. The filtered signal is output to the amplifier 308 which amplifies it and passes it to the downstream receiver 310. Automatic gain controls are provided from the downstream receiver 310 to the RF tuner 304.

The downstream receiver 310 demodulates the amplified signal in accordance with, for example, either a 64-QAM or 256-QAM technique to recover the underlying information signal. The downstream receiver 310 also converts the underlying information signal from an analog form to digital form. This digital data is subsequently provided to the media access control (MAC) 314.

The MAC 314 processes the digital data, which may include, for example, Ethernet packets for transfer to an attached user device. The functions of the MAC 314 may be implemented in hardware or in software. In the example implementation of FIG. 3, the functions of the MAC 314 are implemented in both hardware and software. Software functions of the MAC 314 may be stored in either the RAM 322 or the ROM 324 and executed by the CPU 320. The MAC 314 is in electrical communication with these elements via a shared communications medium 316. The shared communications medium may comprise, for example, a computer bus or a multiple access data network.

The MAC 314 is also in electrical communication with the Ethernet interface 318 via the shared communications medium 316. When appropriate, Ethernet packets recovered by the MAC 314 are transferred to the Ethernet interface 318 for transfer to an attached user device.

The transmitter portion of the cable modem 108 includes an upstream burst modulator 326, a low pass filter 328, a power amplifier 330, and the diplex filter 302. Transmission begins with the reception of a data packet by the MAC 314. The data packet may include data originally received from an attached user device via the Ethernet interface 318. Alternatively, the data packet may be generated by the MAC 314 as part of the cable modem network management and upkeep. The MAC 314 formats the data packet in compliance with the protocols set forth in the DOCSIS specification. The MAC 314 outputs the data packet to the upstream burst modulator 326 which converts it into analog form and modulates it onto a carrier signal in accordance with a particular modulation technique. The modulation technique may comprise, without limitation, a Quadrature Phase Shift Key (QPSK) technique, an 8-Quadrature Amplitude Modulation (QAM) technique, a 16-QAM technique, a 32-QAM technique, or a 64-QAM technique.

The upstream burst modulator 326 outputs the modulated carrier signal to the low pass filter 328 which passes signals with spectral characteristics in a desired bandwidth within the frequency range of approximately 5-42 MHz. The filtered signals are then introduced to the power amplifier 330 which amplifies the signal and provides it to the diplex filter 302. The gain in the power amplifier 330 is regulated by the burst modulator 326. The diplex filter 302 isolates the amplified signal and transmits it upstream over the HFC network 106 during a scheduled burst opportunity.

Figure 4:
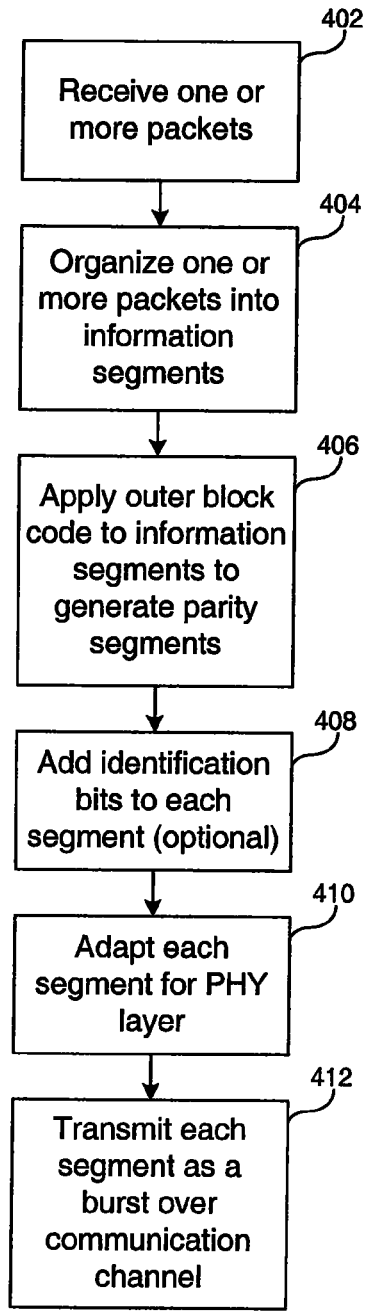
FIG. 4 depicts a flowchart of a method for mitigating burst noise using outer block coding in a transmitting device in accordance with embodiments of the present invention.
Figure 5:
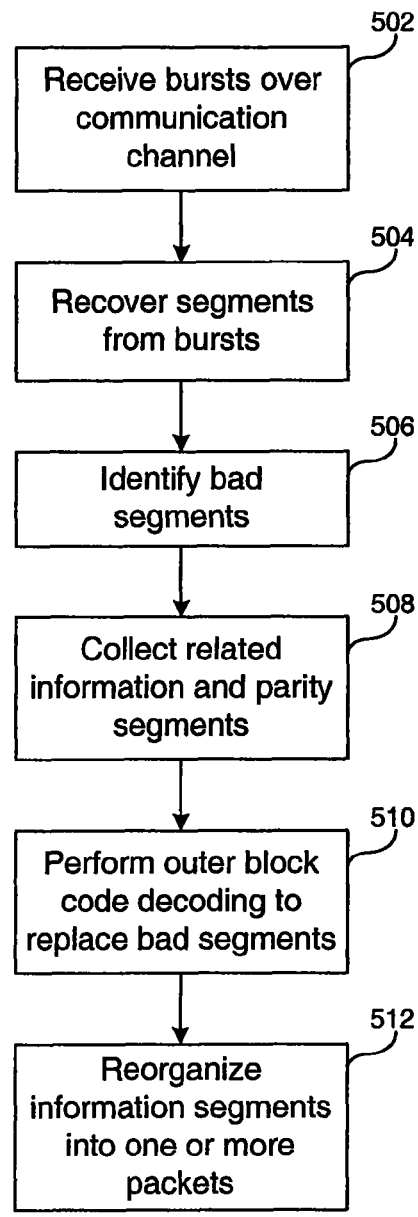
FIG. 5 depicts a flowchart of a method for mitigating burst noise using outer block coding in a receiving device in accordance with embodiments of the present invention.

B. Methods for Mitigating Burst Noise in Accordance with Embodiments of the Present Invention 1. Outer Block Coding FIGS. 4 and 5 depict flowcharts 400 and 500 of methods for mitigating burst noise using outer block coding in a transmitting device and a receiving device in accordance with embodiments of the invention. These flowcharts will be described in reference to an embodiment in which the transmitting device is the cable modem 108a described above in reference to FIG. 3, and the receiving device is the CMTS 104 described above in reference to FIG. 2. However, the invention is not so limited. For example, the transmitting device may be a CMTS and the receiving device may be a cable modem. Alternatively, other transmitting and receiving devices may be used.

The method of flowchart 400 begins at step 402, in which the cable modem 108a receives one or more packets of information for transmission over an upstream channel to the CMTS 104. The packets may include voice, data and/or other information. For example, the packets may comprise part of a continuous stream packets carrying voice information. In an embodiment, the packets arrive at the cable modem 108a via the Ethernet interface 318. In an alternate embodiment, the packets are generated within the cable modem 108a as part of the cable modem network management and upkeep.

At step 404, the one or more packets received at step 402 are collected and reorganized into groups of k information segments. For short packets, this step may comprise simply collecting k packets and identifying each packet as one of k information segments. For longer packets, this step may comprise fragmenting a single packet into k parts, and identifying each part as one of k information segments.

At step 406, an outer block code is applied to the k information segments to generate parity segments. In an embodiment, step 406 entails arranging the k segments as a series of columns and then performing row-wise parity checks on the rows of the matrix formed by the arrangement of the k columns. As will be appreciated by persons skilled in the art, the arrangement of the k information segments into rows and columns is actually a conceptual step and may not comprise a literal process.

The outer block code applied in step 406 may be any of the many block codes available in the literature, such as an (n, k) binary code, and in particular may be an (n, k) Hamming code. In an embodiment in which the outer code is an (n, k) binary code, each row includes a single bit from each of the k segments and parity check equations are used to compute n-k additional parity bits for each row. These n-k parity bits are arranged to form an additional n-k columns, or parity segments. Thus, the parity checks for each row provide a row of bits for the newly created n-k parity segments. If there are m bits in each of the original k segments, then there will be m parity check rows processed, and the newly created n-k parity segments will each have m bits.

Step 408 is an optional processing step in which identification bits are added to each of the k information segments and n-k parity segments. The identification bits may be used to uniquely identify information segments and parity check segments as originating from the same set of n encoded segments. The identification bits may also be used as a counter that establishes the order in which the information segments and parity check segments were originally encoded. In an embodiment, the identification bits may be repeated or otherwise placed in each column with redundancy to increase their robustness beyond the normal data bits in each segment.

In an embodiment, each of the above steps 404 through 408 is performed by the MAC 314 of the cable modem 108a.

At step 410, each of the k information segments and n-k parity check segments is adapted for transmission over the physical (PHY) layer of a cable modem system. In a DOCSIS cable modem system, this step includes prepending a MAC header to each segment, optionally performing FEC encoding on the MAC header and the payload, and then prepending a preamble for subsequent burst transmission. As a result, each segment becomes the payload of a separate upstream burst. This step may also include interleaving of the upstream burst. In an embodiment, the prepending of a MAC header to each segment is performed by the MAC 314 of the cable modem 108a, while FEC encoding, prepending of a preamble, and interleaving is performed by PHY layer logic (not shown in FIG. 3) that resides between the MAC 314 and the upstream burst modulator 326 in the cable modem 108a.

At step 412, the cable modem 108a separately transmits each burst generated in step 410 over an upstream communication channel of the cable modem system to the CMTS 104. In accordance with a DOCSIS cable modem system, the cable modem 108a must request a transmission opportunity from the CMTS for each burst it wishes to transmit over the upstream channel. Burst transmission includes the conversion of each burst into analog form and modulation onto a carrier signal by the upstream burst modulator 326 of the cable modem 108a for transmission during an appropriate time slot.

The method of flowchart 500 begins at step 502, in which the CMTS 104 receives the upstream bursts transmitted from the cable modem 108a during step 412 of flowchart 400. At step 504, a segment is recovered from each upstream burst. This step includes demodulation of each burst and conversion to digital form by the burst receiver 216 of CMTS 104. This step may also include de-interleaving and FEC decoding of the burst data by PHY layer logic within the CMTS that resides between the burst receiver 216 and the headend MAC 218 (not shown in FIG. 2).

As shown at step 506, bad segments are identified, or marked, as a result of the processing of step 504. The marking of a bad segment may be referred to as erasure. A bad segment may be marked based on the receipt of a bad burst preamble. Alternately, a bad segment may be marked as a result of FEC decoding of the burst payload. In the latter case, a bad segment will be marked if more errors are detected in a segment than can be corrected by the FEC technique being used. In a DOCSIS cable modem system, Reed-Solomon (RS) coding is used for FEC; however a parity check code may also be used. In either case, FEC has a high probability of detecting an error, even when it cannot correct the error.

At step 508, the recovered segments are passed to the headend MAC 218 of the CMTS 104 where related information segments and parity segments are collected for application of outer block code decoding. In order to properly decode the segments, the n information segments and parity segments that were originally encoded together must be regrouped in the order in which they were encoded. However, these segments may not necessarily be received by the CMTS 104 in the back-to-back sequence in which they were encoded, due to interspersed transmissions from other cable modems or even from other service flows generated by the same cable modem 108a.

In an embodiment, the MAC 218 utilizes identification bits included in each segment in order to collect related information and parity segments. As discussed above in regard to optional step 408 of flowchart 400, identification bits may be added to each segment to uniquely identify segments that originate from the same set of n encoded segments. As also discussed above, the identification bits may also provide a counter that establishes the order in which the information segments and parity segments were originally encoded. Alternatively, the MAC 218 may group segments by tracking the grant of upstream bursts to the cable modem 108a, which are relayed in a standard DOCSIS MAP message. As will be appreciated by persons skilled in the art, a combination of these techniques, and alternative techniques, may also be used to group the segments.

At step 510, the headend MAC 218 decodes the n related information and parity segments collected in step 508 in accordance with the outer block code originally used to encode them in step 406 of flowchart 400, discussed above in reference to FIG. 4. The outer block decoding step 510 includes arranging the n information and parity segments as n columns, wherein any segments marked as erased in step 506 are placed as erased columns for decoding purposes. As will be appreciated by persons skilled in the art, the arrangement of the segments into columns is actually a conceptual step and may not comprise a literal process. Each row of the matrix formed by the columnar arrangement of the n segments is then decoded to recover bits from erased segments which appear in each row. Decoding of the columns in this manner will also permit error detection and correction of a limited number of individual bit errors in segments that have not been erased, wherein the number of bit errors that may be corrected is determined by the outer block code being used and the number of erased segments. As a result of the decoding step 510, the original k information segments are recovered.

At step 512, the headend MAC 218 reorganizes the k information segments as necessary into one or more packets, reversing the process performed at step 402 of flowchart 400. For example, if each of the k information segments represent fragmented portions of a long packet, then the k segments will be concatenated together to reconstitute the long packet. Alternately, in the case where each of the k information segments represents a single packet, no reorganization is performed. The recovered packets are then available for further processing by the headend MAC 218, which may, for example, forward the packets to a packet-switched network via the Ethernet interface 224.

a. Hamming Block Coding

Figure 6:
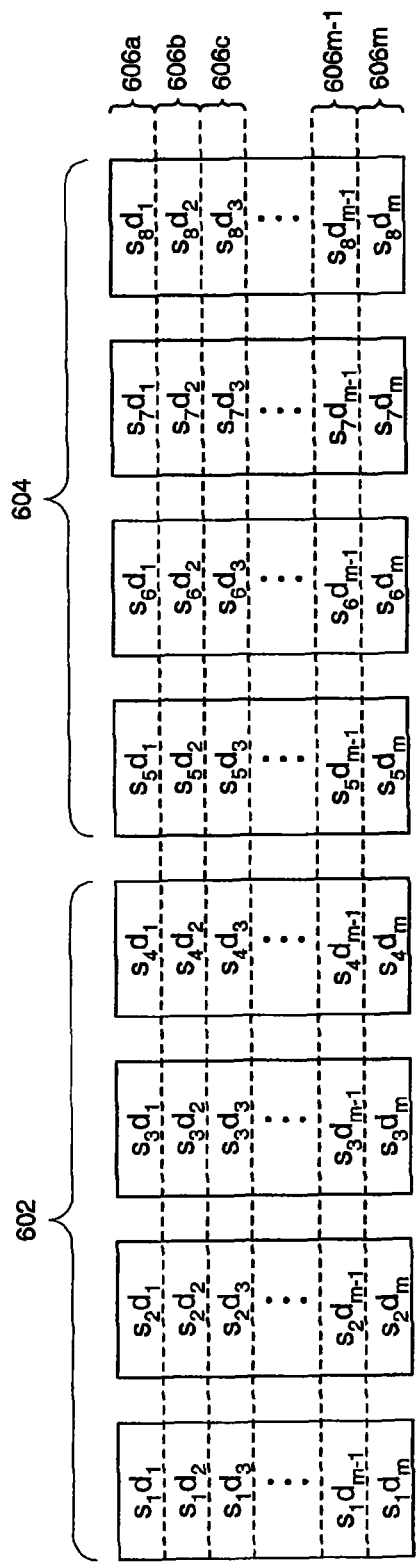
FIG. 6 illustrates the use of a Hamming code technique for performing outer block encoding in accordance with embodiments of the present invention.

An example of the methods of flowchart 400 and flowchart 500 in which the outer block code is an extended (8, 4) Hamming code will now be described. For the purposes of this example, it is assumed that a queue of four m length data packets is collected at the cable modem for upstream transmission and organized as four information segments, s1 through s4, respectively, in accordance with steps 402 and 404 of flowchart 400. As depicted in FIG. 6, the four information segments are arranged as a series of columns 602. In accordance with step 406 of flowchart 400, parity equations for an (8, 4) Hamming code are then applied to each row of four information bits created by the arrangement of columns 602 to calculate four parity bits for each row. For example, with continued reference to FIG. 6, parity check equations are applied to the row of four information bits s1$d$1, s2$d$1, s3$d$1, and s4$d$1, to generate the four parity bits s5$d$1, s6$d$1, s7$d$1 and s8$d$1. Each resulting row of information and parity bits 606a through 606m represents a separate (8, 4) Hamming codeword.

The generation of four parity bits for each row results in the creation of four new columns 604. These four new columns 604 correspond to four new parity segments, s5 through s8.

Figure 7:
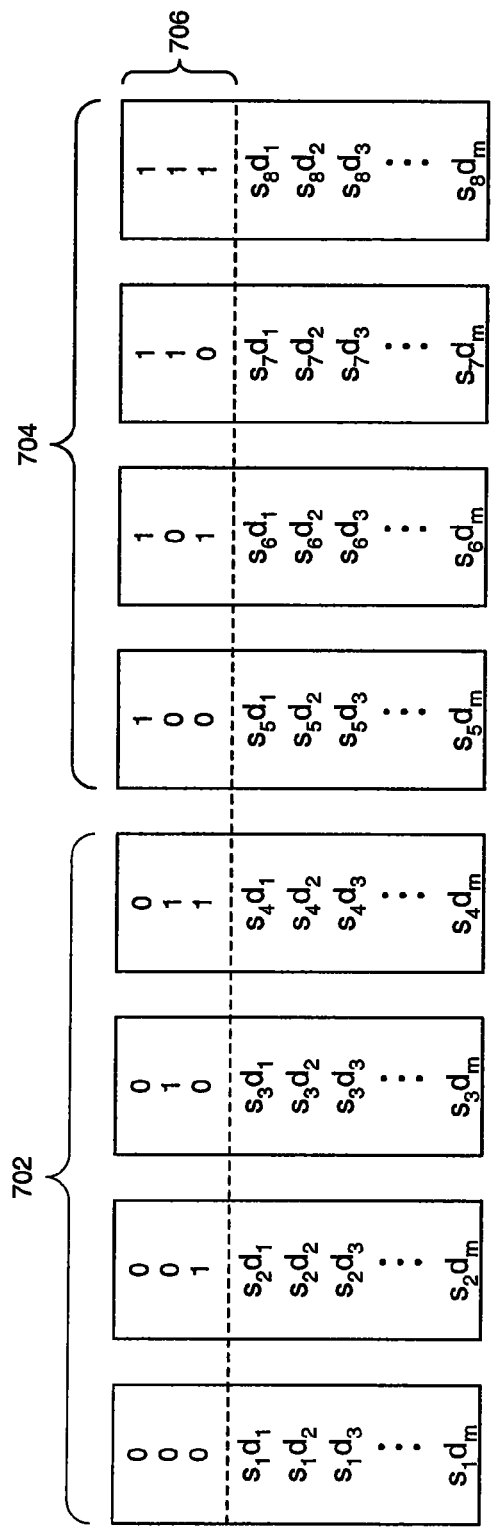
FIG. 7 illustrates the addition of identification bits to a plurality of related information and parity segments in accordance with embodiments of the present invention.

In accordance with step 408 of flowchart 400, identification bits may be added to each segment s1-s8 to uniquely identify the segments as originating from the same set of encoded segments and/or to establish the order in which the segments were originally encoded. FIG. 7 illustrates the prepending of sequential identification bits 706 to the information segments s1 through s4 and the parity segments s5 through s8, which results in extended information segments 702 and parity segments 704. These identification bits identify the encoding order of each of the segments. Although not shown in FIG. 7, a unique identification number identifying the set of packets may also be added to each segment. Note that the rows created by the addition of the identification bits 706 do not represent (8, 4) Hamming codewords.

Each of the segments s1-s8 is then adapted for transmission over the PHY layer of a cable modem system in accordance with step 410 of flowchart 400. As discussed above, this includes prepending a MAC header to each segment, optionally performing FEC encoding on the MAC header and the payload, and then prepending a preamble for subsequent burst transmission. Where FEC is performed, it may be used to encode the identification bits as well as the data included in each segment. Each segment is then transmitted upstream in one of eight separate bursts of upstream transmission using the DOCSIS PHY, in accordance with step 412 of the flowchart 400.

In accordance with steps 502 and 504 of flowchart 500, the eight upstream bursts are received by the CMTS, which recovers the eight segments s1-s8 through the demodulation and optional de-interleaving and FEC decoding of the bursts. Due to an impairment in the upstream channel, one or more of these segments are marked as erased pursuant to step 506 of flowchart 500.

In accordance with step 508 of the flowchart 500, the CMTS then uses the prepended identification bits 706 in each segment to re-assemble the segments s1-s8 in the column arrangement depicted in FIG. 7. Any erased segments in the matrix are identified at this stage. The CMTS then decodes each row of the assembled matrix using the same (8, 4) Hamming code scheme implemented in the cable modem to recover lost information segments. Because an (8, 4) Hamming code has been used, as long as (a) three or fewer segments are erased, or (b) at most one segment is erased and at most one bit error occurs in any row of the remaining seven columns, then the original information segments can be recovered. In 54 out of 70 cases, four of the eight segments can be erased and the original four information segments can still be restored.

b. Exclusive OR (XOR) Coding

In an embodiment of the present invention, the encoding and decoding steps of flowchart 400 and flowchart 500 are performed in accordance with an exclusive OR (XOR) code. The XOR code is essentially a (6, 4) code scheme that is applied to four information segments. For example, the XOR code may be applied to four information segments that result from the division of a single packet. Application of the XOR code to four information segments results in the generation of two parity segments. The first parity segment is the result of performing an exclusive OR operation on the data in the first and fourth information segments and the second parity segment is the result of performing an exclusive OR operation on the data in the second and third information segments. In accordance with this technique, any single information segment can be recovered and in 9 out of 15 cases, two missing information segments can be recovered.

c. Alternate Outer Block Coding Embodiments

In an alternate embodiment of the present invention, the information segments organized in step 404 of flowchart 400 need not be of the same length. Thus, a plurality of packets of different lengths may be directly processed as information segments. For example, with reference to the (8, 4) Hamming code example set forth above, assume that the four information segments, s1 through s4, are each of a different length. In accordance with this alternate embodiment, the three shorter information segments are extended with fill zero data bits prior to row Hamming encoding. As a result, the four parity columns which are created will have the length of the longest of the four original information segments. The fill zeroes may then be stripped off the four information segments after identification bits have been added so that the original information segments are transmitted upstream without the now-unnecessary extending fill bits.

At the CMTS, since five of the segments (the longest information segment and each of the four parity segments) have the maximum length, and at least four must make it successfully over the upstream channel to have a chance of completely recovering the upstream data, the maximum data length of the subset of eight segments successfully making it upstream is used for constructing the matrix for Hamming decoding. Extending fill bits once again are added to the three shortest information segments (or those shorter information segments which survive upstream transmission). In this fashion, the techniques of flowcharts 400 and 500 may be extended to different length information segments.

In a further embodiment, it may be desirable to transmit less than a full set of information segments from the cable modem. This may be the case where the arrival time of packets at the cable modem is not guaranteed. For example, with further reference to the (8, 4) Hamming code example set forth above, it may be desirable to proceed with the upstream transmission of segments even though fewer than a full set of four information segments are in the queue. In this case, complete columns of zero filler data are added as part of step 404 of flowchart 400, until four columns are created. Each of these filler columns has a length equal to the maximum length of the data packets which have arrived in the queue. In accordance with this embodiment, the identification bits subsequently added to each segment, including the four parity segments, in step 408, include a value describing the total number of information segments in the set (one to four in this embodiment). Then, these additional filler columns may be optionally deleted or removed prior to adaptation for the PHY layer at step 410 to maintain upstream efficiency.

At the CMTS, in decoding step 510 of flowchart 500, matrix assembly includes examining the total number of information segments described in the identification bits of each successfully received segment. If the majority of the segments indicate that N information segments were encoded, and N is less than 4, then 4-N filler columns of zero data are assembled beginning with column 4-N+1 and ending at column 4. Decoding then proceeds as if a full eight segments had been received.

2. Repetition Coding

Figure 8:
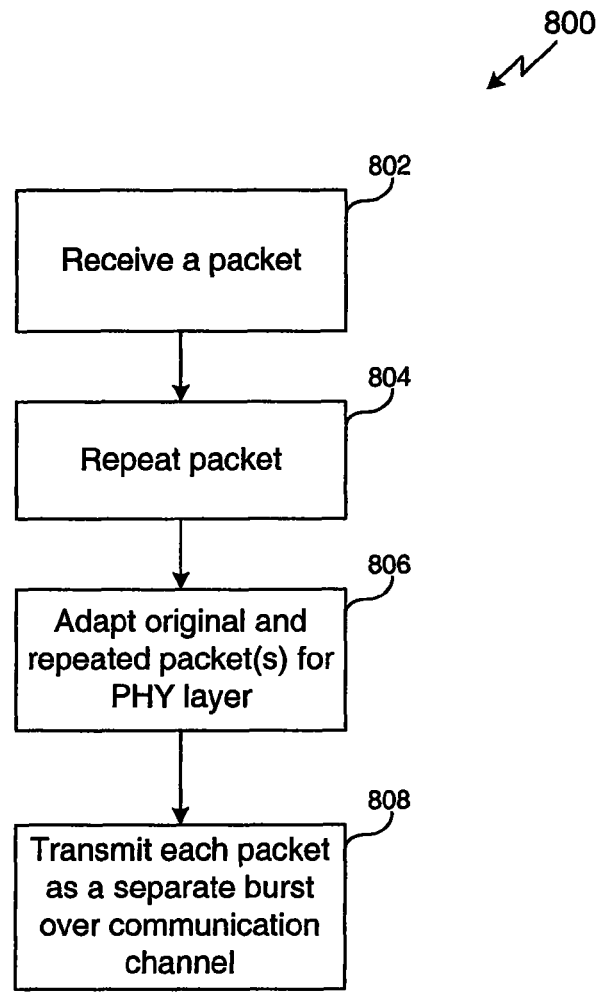
FIG. 8 depicts a flowchart of a method for mitigating burst noise using repetition coding in a transmitting device in accordance with embodiments of present the invention.
Figure 9:
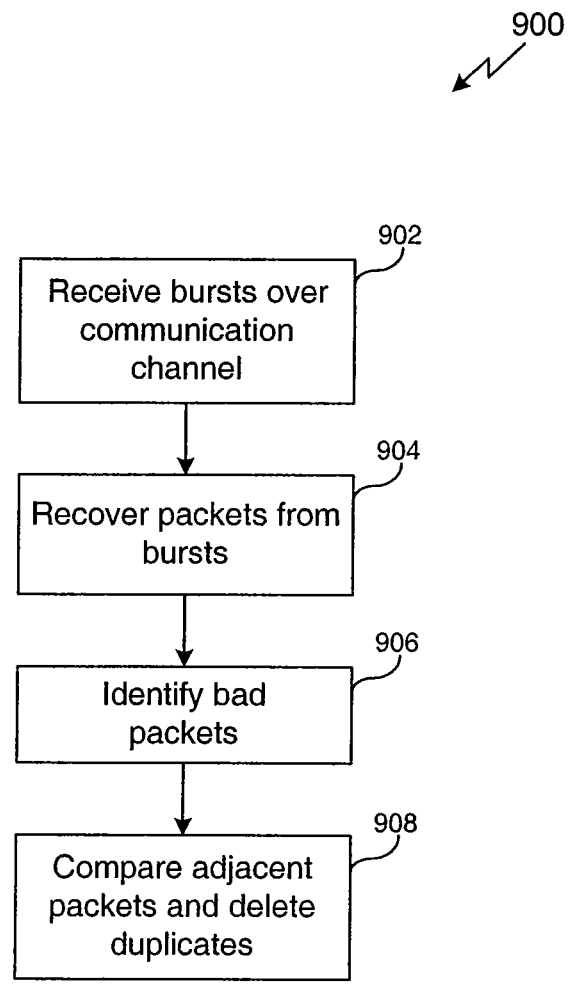
FIG. 9 depicts a flowchart of a method for mitigating burst noise using repetition coding in a receiving device in accordance with an embodiment of the present invention.

FIGS. 8 and 9 depict flowcharts 800 and 900 of methods for mitigating burst noise using repetition coding in a transmitting device and a receiving device in accordance with embodiments of the invention. These flowcharts will be described in reference to an embodiment in which the transmitting device is the cable modem 108a described above in reference to FIG. 3, and the receiving device is the CMTS 104 described above in reference to FIG. 2. However, the invention is not so limited. For example, in an embodiment, the transmitting device may be a CMTS and the receiving device may be a cable modem. Alternatively, other transmitting and receiving devices may be used.

The method of flowchart 800 begins at step 802, in which the cable modem 108a receives a packet of information for transmission over an upstream channel to the CMTS 104. The packet may include voice, data and/or other information. For example, the packet may comprise part of a continuous stream of packets carrying voice information. In an embodiment, the packet arrives at the cable modem 108a via the Ethernet interface 318. In an alternate embodiment, the packet is generated within the cable modem 108a as part of the cable modem network management and upkeep.

At step 804, the packet received at step 802 is copied, or repeated, to generate a total of N packets, where N is an integer of 1 or more. Although any value of N may be used in accordance with embodiments of the present invention, practical values for N, taking into account network bandwidth concerns, may include N=2 or N=3. In an embodiment, step 804 is performed by the MAC 314 of the cable modem 108a.

At step 806, the original packet received in step 802 and the repeated packets generated in step 804 are each adapted for transmission over the physical (PHY) layer of a cable modem system. In a DOCSIS cable modem system, this step includes prepending a MAC header to each packet, optionally performing FEC encoding on the MAC header and the payload, and then prepending a preamble for subsequent burst transmission. As a result, each packet becomes the payload of a separate upstream burst. This step may also include interleaving of the upstream burst. In an embodiment, the prepending of a MAC header to each segment is performed by the MAC 314 of the cable modem 108a, while FEC encoding, prepending of a preamble, and interleaving is performed by PHY layer logic (not shown in FIG. 3) that resides between the MAC 314 and the upstream burst modulator 326 in the cable modem 108a.

At step 808, the cable modem 108a separately transmits each burst generated in step 806 over an upstream communication channel of a cable modem system to the CMTS 104. Burst transmission includes the conversion of each burst into analog form and modulation onto a carrier signal by the upstream burst modulator 326 of the cable modem 108a for transmission during an appropriate time slot.

In accordance with a DOCSIS cable modem system, to ensure that repeated packets have allocated minislots (i.e., grants) for upstream transmission, either the cable modem 108a must request additional minislots from the CMTS 104, or the CMTS must automatically make the necessary additional grants at some point later in time for repeated packets. The time delay between grants for a given repeated packet may be constant, or random, based on efficiently filling the available DOCSIS MAP space. Alternatively, the time delay may be based on avoiding periodic impulse noise. For example, in a case of repetition coding where N=3, the spacing between the first and second grant may be different from the spacing between the second and third grant. This prevents the case of periodic impulses obliterating all three packets due to a synchronization between the periodic impulses and the repeated packets. The optimal spacing between repeated packets will depend on the assumed impulse interarrival time statistics. For CMTS systems which sample, detect, and classify impulse events, this information may be used by the CMTS to determine the optimal spacing of repeated grants. Such a system is disclosed in commonly-owned patent application Ser. No. 09/988,065, entitled "Method and Apparatus for the Detection and Classification of Impairments on an RF Modulated Network," filed Nov. 16, 2001, incorporated by reference in its entirety herein.

The method of flowchart 900 begins at step 902, in which the CMTS 104 receives the upstream bursts transmitted from the cable modem 108*a* during step 808 of flowchart 800. At step 904, a packet is recovered from each upstream burst. This step includes demodulation of each burst and conversion to digital form by the burst receiver 216 of CMTS 104. This step may also include de-interleaving and FEC decoding of the burst data by PHY layer logic within the CMTS that resides between the burst receiver 216 and the headend MAC 218 (not shown in FIG. 2).

As shown at step 906, bad packets are identified, or marked, as a result of the processing of step 904. The marking of a bad packet may be referred to as erasure. A bad packet may be marked based on the receipt of a bad burst preamble. Alternately, a bad packet may be marked as a result of FEC decoding of the burst payload. In the latter case, a bad packet will be marked if more errors are detected in a packet than can be corrected by the FEC technique being used. In a DOCSIS cable modem system, Reed-Solomon (RS) coding is used to encode the burst payload; however a parity check code may also be used. In either case, FEC has a high probability of detecting an error, even when it cannot correct the error.

At step 908, the recovered packets are passed to the headend MAC 218 of the CMTS 104, which compares successfully received adjacent packets from a given cable modem service flow and eliminates duplicates, if any, based on the assumption that that they are simply repetitions. In accordance with this technique, provided at least one of the N packets transmitted from the cable modem 108*a* has not been erased, the headend MAC 218 will able to recover the original packet.

Figure 10:
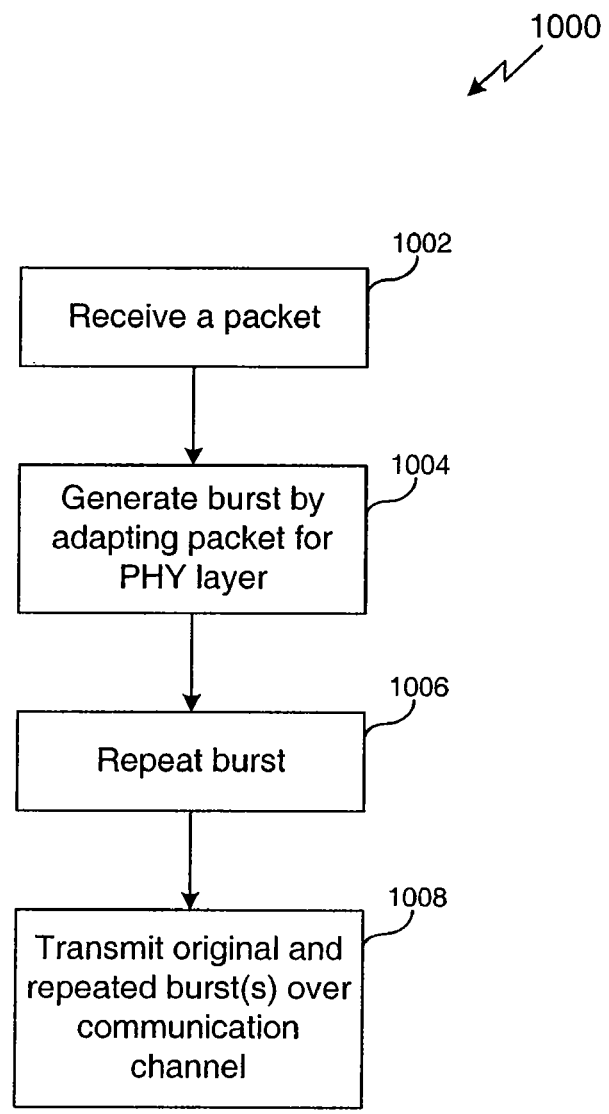
FIG. 10 depicts a flowchart of an alternate method for mitigating noise using repetition coding in a transmitting device in accordance with embodiments of the present invention.

Note that in an alternate embodiment of the present invention, the repetition step 804 of flowchart 800 could be moved to follow the step of adapting a packet for the PHY layer. This alternate embodiment is illustrated in flowchart 1000 of FIG. 10. As shown in FIG. 10, step 1002 includes receiving a packet for transmission over a communication channel, step 1004 includes adapting the packet for the PHY layer, resulting in the generation of a burst, and step 1006 includes copying, or repeating, the burst, to generate a total of N bursts, where N is an integer of 1 or more. The original and repeated bursts are then separately transmitted over the communication channel at step 1008.

3. Retransmission

Figure 11:
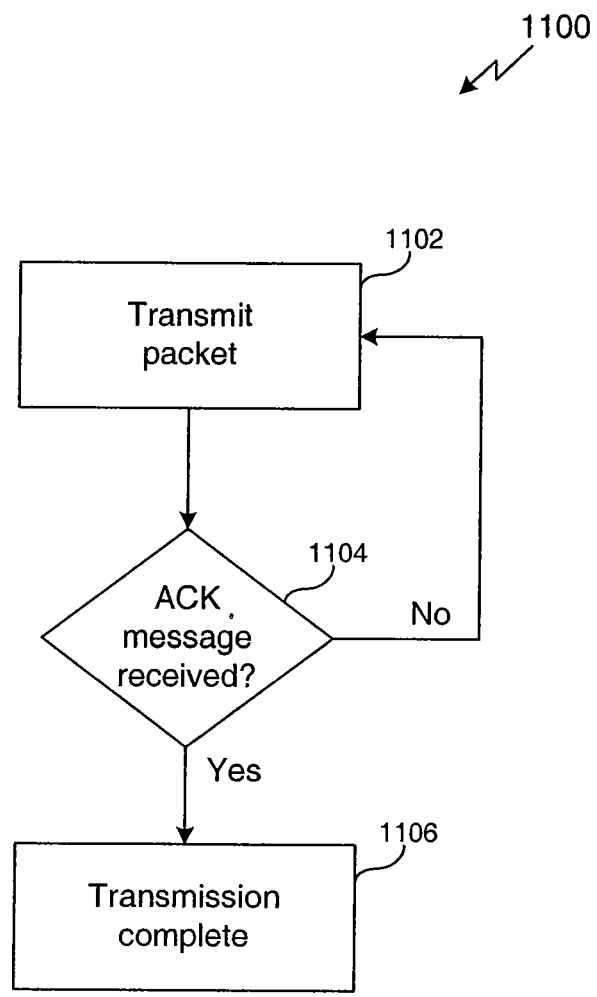
FIG. 11 depicts a flowchart of a method for mitigating burst noise using retransmission techniques in a transmitting device in accordance with embodiments of the invention.
Figure 12:
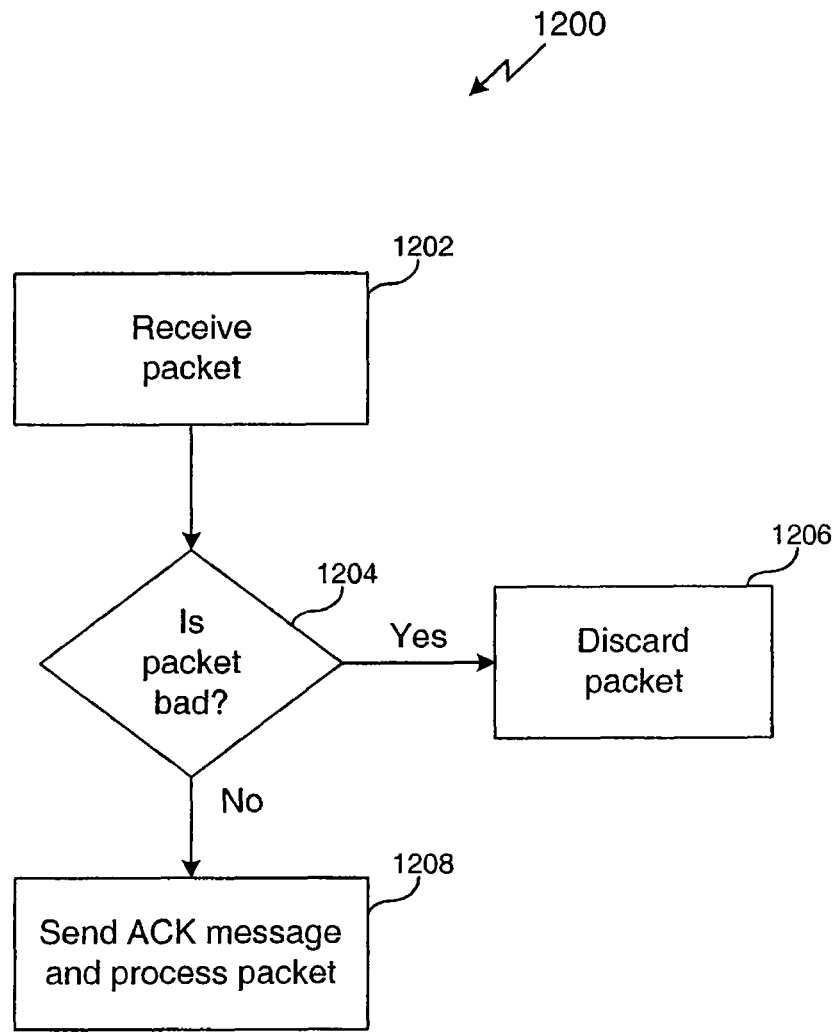
FIG. 12 depicts a flowchart of a method for mitigating burst noise using retransmission techniques in a receiving device in accordance with embodiments of the invention.

FIGS. 11 and 12 depict flowcharts 1100 and 1200 of a method for mitigating burst noise using retransmission techniques in a transmitting device and a receiving device in accordance with embodiments of the invention. These flowcharts will be described in reference to an embodiment in which the transmitting device is the cable modem 108*a* described above in reference to FIG. 3, and the receiving device is the CMTS 104 described above in reference to FIG. 2. However, the invention is not so limited. For example, in an embodiment, the transmitting device may be a CMTS and the receiving device may be a cable modem. Alternatively, other transmitting and receiving devices may be used.

In accordance with the method of flowchart 1100, the cable modem 108*a* transmits a packet over an upstream channel to the CMTS 104 at step 1102. At step 1104, the cable modem 108*a* waits for a predetermined amount of time to receive an acknowledge (ACK) message over a downstream channel from the CMTS 104 that indicates that the packet transmitted in step 1102 was received successfully (in other words, it was received and not determined to be a bad packet by the CMTS 104). If an ACK message is received within the predetermined amount of time, then the transmission of the packet is complete, as indicated at step 1106. However, if an ACK message is not received within the predetermined amount of time, then the cable modem 108*a* retransmits the packet, which is indicated by the arrow returning to step 1102 from step 1104 in flowchart 1100. In an embodiment of the present invention, the MAC 314 of the cable modem 108*b* is responsible for determining whether or not to retransmit a packet.

In an embodiment of the present invention, the cable modem 108*a* continues to retransmit a packet until such time as an appropriate ACK message is received from the CMTS 104. In an alternate embodiment, the cable modem 108*a* retransmits a packet only a fixed number of times before abandoning transmission of the packet. In such an embodiment, one or more retransmission may be attempted.

The method of flowchart 1200 begins at step 1202, in which the CMTS 104 receives the packet transmitted by the cable modem 108*a* in step 1102 of flowchart 1100. At step 1204, the CMTS 104 determines if the packet is bad. For example, in an embodiment, the CMTS 104 identifies the packet as bad when it includes errors that cannot be corrected by FEC or if it has a bad burst preamble. If the packet is bad, then the CMTS 104 discards the packet as shown at step 1206. However, if the packet is not bad then the CMTS 104 sends an ACK message to the cable modem 108*a* indicating that the packet was received successfully, and continues to process the packet as shown at step 1208.

Figure 13:
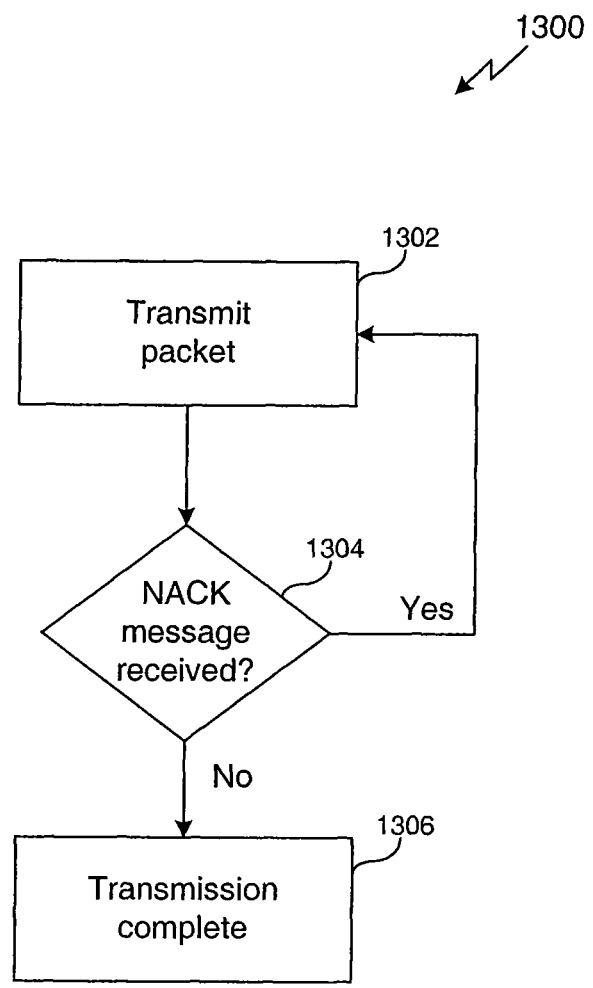
FIG. 13 depicts a flowchart of an alternate method for mitigating burst noise using retransmission techniques in a transmitting device in accordance with embodiments of the invention.
Figure 14:
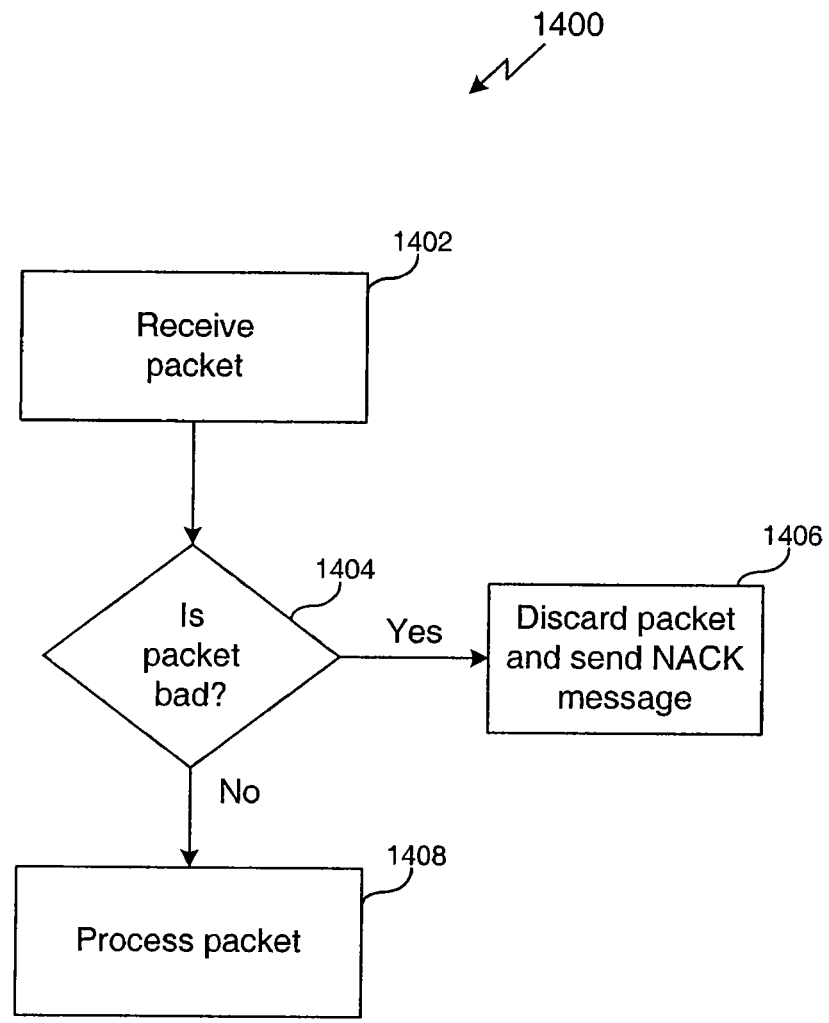
FIG. 14 depicts a flowchart of an alternate method for mitigating burst noise using retransmission techniques in a receiving device in accordance with embodiments of the invention.

In an alternate embodiment of the present invention, a retransmission technique is implemented that utilizes non-acknowledgment messages (NACKs) rather than ACKs for determining when to retransmit a packet. This alternate embodiment is illustrated in flowcharts 1300 and 1400 of FIGS. 13 and 14, respectively.

In accordance with the method of flowchart 1300, the cable modem 108*a* transmits a packet over an upstream channel to the CMTS 104 at step 1302. At step 1304, the cable modem 108*a* waits for a predetermined amount of time to receive a NACK message from the CMTS 104 over a downstream channel that indicates that the packet transmitted in step 1302 has not been received successfully. If a NACK message is not received within the predetermined amount of time, then the transmission of the packet is complete, as indicated at step 1306. However, if a NACK message is received within the predetermined amount of time, then the cable modem 108*a* retransmits the packet, which is indicated by the arrow returning to step 1302 from step 1304 in flowchart 1300. The packet may be continually retransmitted until such time as a NACK message is not received, or may be retransmitted only a fixed number of times.

The method of flowchart 1400 begins at step 1402, in which the CMTS 104 receives the packet transmitted by the cable modem 108a in step 1302 of flowchart 1300. At step 1404, the CMTS 104 determines if the packet is bad. For example, in an embodiment, the CMTS 104 identifies the packet as bad when it includes errors that cannot be corrected by FEC or if it has a bad burst preamble. If the packet is bad, then the CMTS 104 discards the packet and sends a NACK message to the cable modem 108a indicating that the packet was not received successfully as shown at step 1406. However, if the packet is not bad then the CMTS 104 continues to process the packet as shown at step 1408.

4. FEC Block Reconstruction

Embodiments of the present invention may take advantage of the fact that packets are often transmitted as two or more FEC encoded blocks, or "FEC blocks." For example, in a DOCSIS cable modem system, a cable modem may encode a packet using Reed Solomon (RS) techniques to produce two or more FEC blocks, each of which form part of the same upstream burst. During transmission, burst noise on the upstream channel may interfere with some, but not all, of the FEC blocks. Consequently, the CMTS may recover some of the FEC blocks, while erasing others. As will be described in more detail below, the ability of the CMTS to recover at least a portion of a plurality of FEC blocks in a burst permits the CMTS to restore lost information in a manner that is more efficient than if the entire packet were erased.

a. FEC Block Reconstruction and Outer Block Coding

The fact that the CMTS may recover one or more of the FEC blocks of a packet that has been impacted by burst noise can enhance the effectiveness of the outer block coding technique described above in reference to FIGS. 4 and 5. To illustrate this concept, assume that the outer block code is the (8, 4) Hamming block code described above, which permits four information segments to be recovered by the CMTS provided that no more than three of the eight transmitted segments (four information segments plus four parity segments) are erased.

Figure 15:
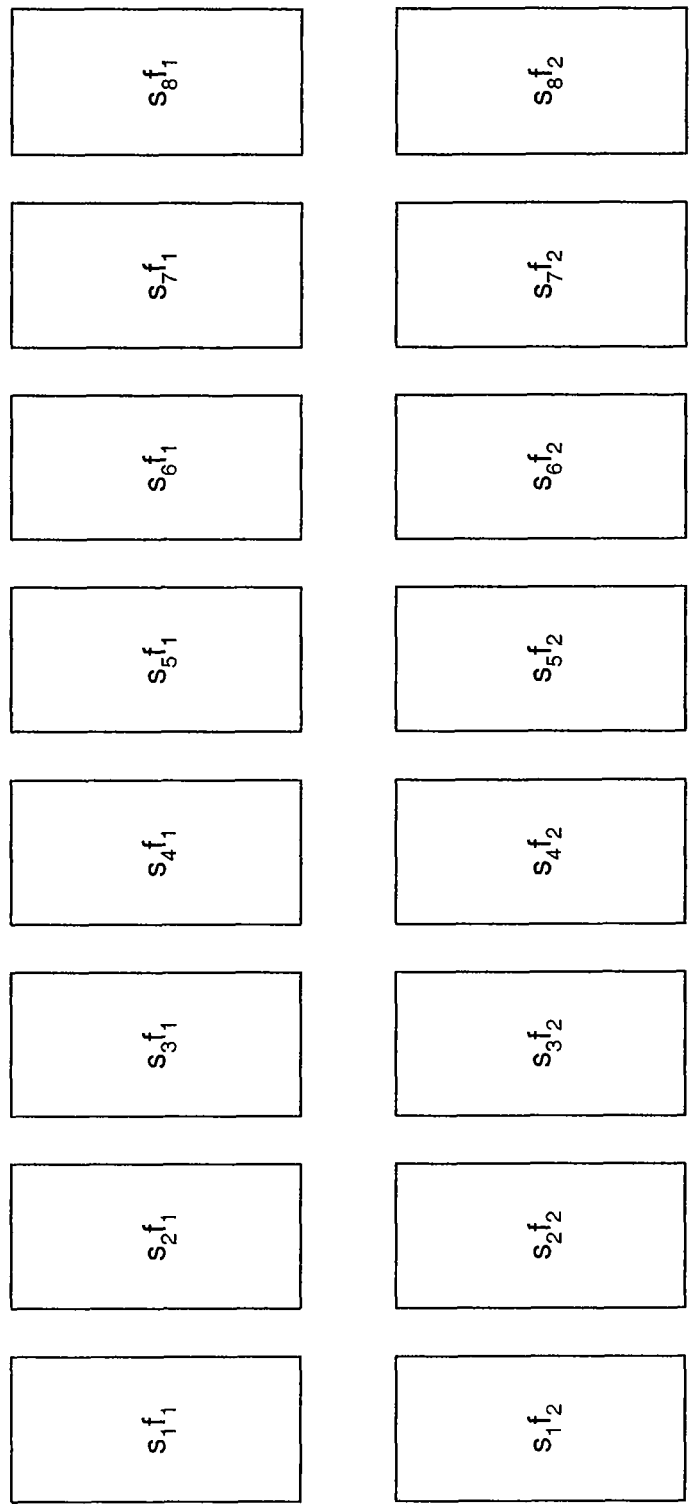
FIG. 15 illustrates the use of a Hamming code technique for performing outer block encoding on FEC blocks in accordance with embodiments of the present invention.

However, assume that each of the information and parity segments in this example has been FEC encoded to generate a first FEC block followed by a second FEC block. This is illustrated in FIG. 15, in which information segment s1 has been FEC encoded to generate FEC blocks s1/1 and s1/2, information segment s2 has been FEC encoded to generate FEC blocks s2/1 and s2/2, information segment s3 has been FEC encoded to generate FEC block s3/1 and s3/2, and information segment s4 has been FEC encoded to generate FEC blocks s4/1 and s4/2. Likewise, parity segment s5 has been FEC encoded to generate FEC blocks s5/1 and s5/2, parity segment s6 has been FEC encoded to generate FEC blocks s6/1 and s6/2, parity segment s7 has been FEC encoded to generate FEC blocks s7/1 and s7/2, and parity segment s8 has been FEC encoded to generate FEC block s8/1 and s8/2.

In accordance with this example, as long as no more than three of the eight first FEC blocks in each segment are bad, then the first FEC block in each information segment may be recovered, and as long as no more than three of the eight second FEC blocks in each segment are bad, then the second FEC block in each information segment may be recovered. Thus, with continued reference to FIG. 15, as long as no more than three of the first FEC blocks s1/1 through s8/1 are bad, then the first FEC blocks s1/1 through s4/1 in each information segment s1 through s4 may be recovered. Likewise, as long as no more than three of the eight second FEC blocks s1/2 through s8/2 are bad, then the second FEC blocks s1/2 through s4/2 in each information segment s1 through s4 may be recovered. As a result, there may be instances where as many as six out of the eight segments transmitted have a bad FEC block due to burst noise, but nevertheless all four information segments may be recovered.

In order to implement this technique, the methods already described in reference to flowchart 400 of FIG. 4 and flowchart 500 of FIG. 5 may be used with slight modification. In this case, step 410 of flowchart 400 would necessarily include FEC encoding each information and parity segment to generate two or more FEC blocks per segment. In other words, each segment is divided into two or more FEC blocks prior to transmission over the upstream channel. On the receiving side, step 506 would comprise identifying bad FEC blocks within each segment, rather than simply identifying bad segments, and step 510 would comprise performing outer block code decoding to replace bad FEC blocks within each segment, rather than to replace bad segments.

Where a bad FEC block cannot be recovered through the application of the outer block code, the FEC block, or the segment containing the bad FEC block, can be re-requested from the cable modem. Alternately, a repetition technique, as described below, may be utilized to ensure successful transmission of the FEC block.

b. FEC Block Reconstruction and Repetition Coding

Figure 16:
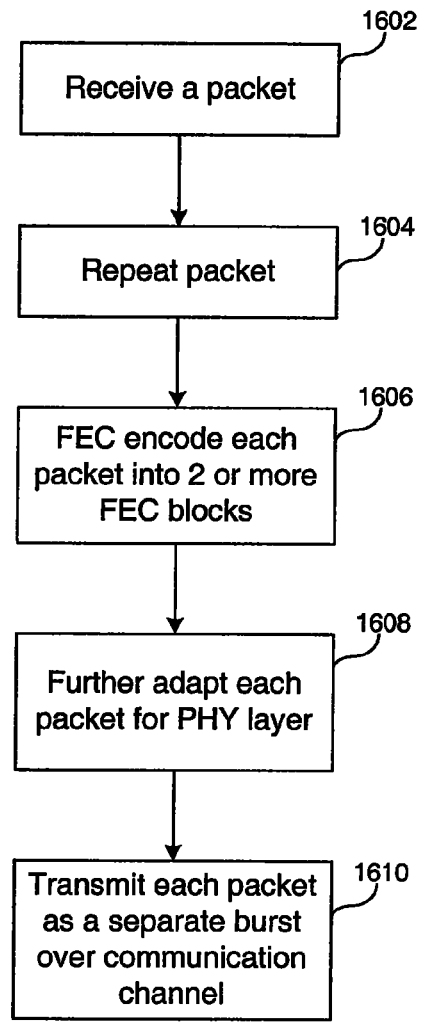
FIG. 16 depicts a flowchart of a method for mitigating burst noise using repetition and FEC block reconstruction techniques in a transmitting device in accordance with embodiments of the invention.
Figure 17:
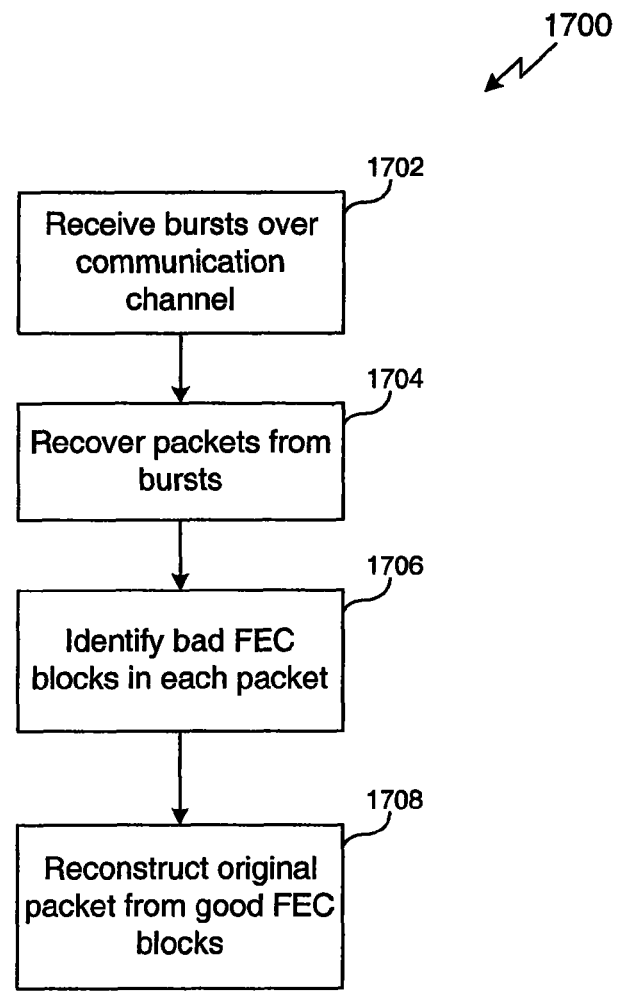
FIG. 17 depicts a flowchart of a method for mitigating burst noise using repetition and FEC block reconstruction techniques in a receiving device in accordance with embodiments of the invention.

FIGS. 16 and 17 depict flowcharts 1600 and 1700 of methods for mitigating burst noise using repetition and FEC block reconstruction techniques in a transmitting device and a receiving device in accordance with embodiments of the invention. These flowcharts will be described in reference to an embodiment in which the transmitting device is the cable modem 108a described above in reference to FIG. 3, and the receiving device is the CMTS 104 described above in reference to FIG. 2. However, the invention is not so limited. For example, in an embodiment, the transmitting device may be a CMTS and the receiving device may be a cable modem. Alternatively, other transmitting and receiving devices may be used.

The method of flowchart 1600 begins at step 1602, in which the cable modem 108a receives a packet of information for transmission over an upstream channel to the CMTS 104. At step 1604, the packet received at step 1602 is copied, or repeated, to generate a total of N packets, where N is an integer of 1 or more.

At step 1606, the original packet received in step 1602 and the repeated packets generated in step 1604 are each FEC encoded into 2 or more FEC blocks. In a DOCSIS cable modem system, this step comprises applying a Reed-Solomon algorithm to each packet to generate 2 or more FEC blocks per packet. At step 1608, each packet is further adapted for transmission over the physical (PHY) layer of a cable modem system. For example, a preamble may be prepended to the FEC blocks for subsequent burst transmission. As a result of steps 1606 and 1608, each packet becomes the payload of a separate upstream burst.

At step 1610, the cable modem 108a separately transmits each burst generated in steps 1606 and 1608 over an upstream communication channel of a cable modem system to the CMTS 104.

At the first step 1702 of flowchart 1700, the CMTS 104 receives the upstream bursts transmitted from the cable modem 108a during step 1610 of flowchart 1600. At step 1704, a packet is recovered from each upstream burst. This step includes FEC decoding of the burst data. At step 1706, the bad FEC blocks associated with each packet are identified.

At step 1708, the recovered packets are passed to the headend MAC 218 of the CMTS 104, which attempts to identify at least one complete packet that has been received successfully from the N packets transmitted from the cable modem 108a. If no complete packets have been received successfully, then the headend MAC 218 will attempt to reconstruct the original packet from successfully received FEC blocks from each of the N packets transmitted from the cable modem 108a. Provided that the burst noise or other impairment on the communication channel affected different FEC blocks of each repeated packet, the MAC 218 will be able to reconstruct the complete packet from the good FEC blocks of each packet. In an embodiment, the headend MAC 218 keeps track of good FEC blocks by building a list of successfully received FEC blocks from each packet.

c. Alternative FEC Block Reconstruction Embodiments

Alternative techniques for mitigating burst noise using FEC block reconstruction in accordance with embodiments of the present invention will now be described.

In an embodiment of the present invention, the CMTS receives a packet from the cable modem and identifies bad FEC blocks within each packet. The CMTS then sends a request to the cable modem to retransmit only those FEC blocks that were in error, while storing the good FEC blocks. When the CMTS subsequently receives the retransmitted FEC blocks from the cable modem, it reconstructs the complete packet and forwards it for further processing. If the retransmitted FEC blocks are still in error, the CMTS may send a second retransmission request, either in the same manner as before, or perhaps modifying some of the signaling parameters so that the FEC blocks may be retransmitted using a different channel or time slot relative to the interference.

In accordance with this technique, a protocol is required for the CMTS to request the retransmission of bad FEC blocks. In a cable modem system, this protocol may be implemented using the DOCSIS protocol with extensions for data ACKs and/or NACKs, a separate protocol using an out-of-band channel, or an Ethernet protocol whereby the CMTS sends the retransmission request to the cable modem as an Ethernet packet. Another method of retransmitting FEC blocks that were erased is to use the REQ/DAT structure of DOCSIS for retransmitting individual FEC blocks. Several REQ/DAT packets may need to be sent in order to retransmit all FEC blocks that were originally erased.

In another embodiment, if the CMTS receives a packet with one or more bad FEC blocks, it transmits data ACKs and/or NACKs to request that the cable modem retransmit the entire original packet. The CMTS saves the FEC blocks that were successfully received from each attempt and reconstructs the original packet when all FEC blocks have been correctly received.

In a further embodiment, a combination of repetition coding and data ACKs/NACKs are used to implement FEC block reconstruction. In this embodiment, packets are initially transmitted from the cable modem to the CMTS using repetition coding as described herein. If the CMTS determines that the same FEC block in each of N repeated packets is bad, then the CMTS transmits data ACKSs and/or NACKs to the cable modem to request that the FEC block be selectively retransmitted and possibly repeated as well to increase robustness and minimize latency. Alternately, the initial packet can be sent once, and if it is received by the CMTS with bad FEC blocks, those FEC blocks can be retransmitted and repetition coded to improve the chance that the erased FEC blocks will survive transmission the second time.

5. Outer Coding and Packet Header Suppression

The outer coding techniques described above may have an adverse effect on network capacity. Indeed, where the outer coding technique is a repetition code, sending a single packet several times reduces the overall capacity of the network by the same amount as the repetition factor. For example, sending a packet two times will consume twice as much capacity as sending it a single time, reducing network capacity to 50%.

One way to mitigate this reduction in capacity is to utilize packet header suppression technology in conjunction with such outer coding techniques to reduce the size of each packet. For example, Broadcom's Propane™ header suppression technology may be used to offset the bandwidth-consuming effect of repetition coding. Propane™ is an advanced transport technology for DOCSIS-based cable modem systems that is available from Broadcom Corporation of Irvine, Calif.

In the case of small packets, a large percentage of the total packet consists of protocol headers. These headers are highly structured and can be coded to a much smaller size in most cases. Application of Propane™ packet header suppression in a DOCSIS environment results in a 50% capacity savings over uncompressed packets. When used in conjunction with outer coding for small packets, Propane™ transport technology completely mitigates the capacity effects of repetition coding where the repetition factor is N=2. Where the repetition factor is N=3, using Propane™ transport technology results in network capacity of 66% as opposed to 33% for uncompressed packets.

To use Propane™ transport technology in conjunction with outer coding in accordance with embodiments of the present invention, a transmitting device preferably encodes a packet to be transmitted by the Propane™ coding process prior to the application of outer coding (e.g., outer block coding or repetition coding). At the receiving device, the outer code decoding process preferably reassembles the packet and corrects errors as needed prior to decoding of the packet by the Propane™ process, which results in the full-size original packet. Alternately, packet header suppression may be applied by the transmitting device after application of outer coding and by the receiving device prior to outer code decoding.

Relevant packet header suppression techniques for cable modem systems are also set forth in the following commonly owned, co-pending patent applications: "Cable Modem System and Method for Supporting Extended Protocols," U.S. patent Ser. No. 09/973,875, filed Oct. 11, 2001 by Bunn et al., "Cable Modem System and Method for Dynamically Mixing Protocol Specific Header Suppression Techniques," U.S. patent Ser. No. 09/973,781, filed Oct. 11, 2001 by Bunn et al., "Efficiently Transmitting RTP Protocol in a Network that Guarantees In Order Delivery of Packets," U.S. patent Ser. No. 09/973,872, filed Oct. 11, 2001 by Bunn et al., and "Dynamic Delta Encoding for Cable Modem Header Suppression," U.S. patent Ser. No. 09/973,871, filed Oct. 11, 2001 by Bunn et al. Each of these applications is incorporated by reference as if set forth herein in their entirety.

6. Outer Coding of Downstream Transmissions in a Cable Modem System

As will be appreciated by persons skilled in the relevant art(s), the techniques set forth above may be advantageously applied to downstream transmissions from a CMTS to a cable modem, even where these transmissions are continuous as in a DOCSIS cable modem system. While the DOCSIS downstream implements FEC and interleaving in the PHY layer to combat burst noise, additional burst noise mitigation can be gained by implementing methods in accordance with the present invention on the downstream link.

On the DOCSIS downstream, packets for a particular cable modem or service flow may or may not be transmitted contiguously. Thus, in accordance with an embodiment of the present invention, outer coding may be applied to one or more packets with different cable modem or service flow destinations, which will serve to increase the robustness of the downstream link in the presence of severe impairments. In any case, the downstream PHY will be unaffected by the addition of the higher level outer coding, except that it may now be required to carry more traffic as bursts carrying parity segments or repeated packets are transmitted. This increased traffic may be offset, however, by the fact that fewer retransmissions may be required in the downstream due to the resultant mitigation of burst errors.

7. Transmission Scheduling

In accordance with embodiments of the present invention, outer encoded packets (e.g., block-encoded information and parity segments or repetition-coded packets) are transmitted in separate bursts, as opposed to bundling of outer encoded packets. The separation of these outer encoded packets in their transmission through the channel is critical in any medium where the success or failure of an entire burst transmission (or portion of transmission in a continuous emission) may occur. An example is a burst transmission system where preamble, post-amble, or other synchronization symbols or methods are disbursed around or within the information waveform, and wherein an impairment level within the channel sometimes cause the burst to not be properly or adequately synchronized and adjusted at the receiver, so that much of the information in the burst is not recoverable at the receiver.

Another example is a transitory impairment, which may impact the medium so severely that an entire burst is lost or severely corrupted if coincident with the rise in the impairment (or in a continuous transmission, the impairment causes an outage for a significant duration of time). Examples of such impairments include but are not limited to the many types of fading experienced and described in wireless communications, and in the burst noise environment described herein in reference to cable modem systems.

Thus, in accordance with outer block coding embodiments of the present invention, it is critical that the individual bits of each information segment are separated into columns and that each row created thereby is covered with parity checks, creating new parity segments. It is also critical that each of these segments be transmitted separately (such as separate bursts in a bursted scheme, or perhaps separated in time in a continuous scheme), and received, assembled and processed as individual columns at the receiver, and then, after recovering the individual columns wherever possible, applying row parity to fill in lost and/or severely corrupted columns, a row at a time.

C. Example Software Implementation

As discussed elsewhere herein, the above-described techniques or methods may be implemented as software routines that are executed, in part, by the MAC of a cable modem and/or the headend MAC of a CMTS. For example, with reference to the example implementation of the CMTS 104 described in reference to FIG. 2, the headend MAC 218 performs necessary method steps by executing software functions with the assistance of the CPU 222. These software functions may be stored in either RAM 220 or ROM 218. Furthermore, with reference to the example implementation of the cable modem 108a described in reference to FIG. 3, the MAC 314 performs necessary method steps by executing software functions with the assistance of the CPU 320. These software functions may be stored in either RAM 322 or ROM 324.

Figure 18:
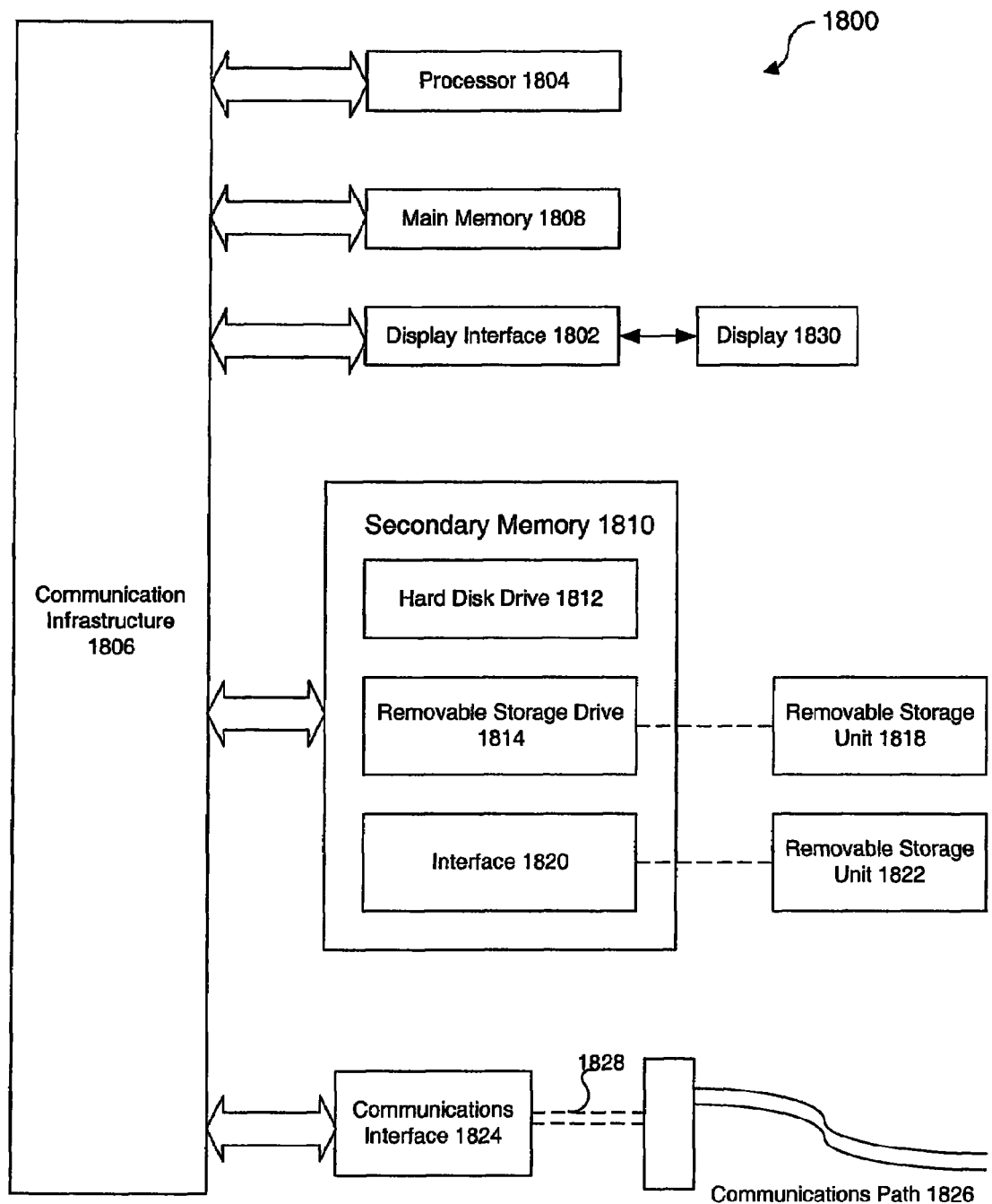
FIG. 18 is a block diagram of an exemplary computer system for implementing all or part of a method for mitigating burst noise in accordance with embodiments of the present invention.

However, methods of the present invention need not be limited to these embodiments. For example, the methods of the present invention may be embodied in software routines which are executed on computer systems, such as a computer system 1800 as shown in FIG. 18. Various embodiments are described in terms of this exemplary computer system 1800. After reading this description, it will be apparent to a person skilled in the relevant art how to implement the invention using other computer systems and/or computer architectures.

The computer system 1800 includes one or more processors, such as processor 1804. The processor 1804 is connected to a communication infrastructure 1806. The computer system 1800 also includes a main memory 1808, preferably random access memory (RAM), and may also include a secondary memory 1810. The secondary memory 1810 may include, for example, a hard disk drive 1812 and/or a removable storage drive 1814, representing a floppy disk drive, a magnetic tape drive, an optical disk drive, etc. The removable storage drive 1814 reads from and/or writes to a removable storage unit 1816 in a well-known manner. Removable storage unit 1816, represents a floppy disk, magnetic tape, optical disk, etc., which is read by and written to by removable storage drive 1814. As will be appreciated, the removable storage unit 1816 includes a computer usable storage medium having stored therein computer software and/or data.

In alternative embodiments, secondary memory 1810 may include other similar means for allowing computer programs or other instructions to be loaded into computer system 1800. Such means may include, for example, a removable storage unit 1822 and an interface 1820. Examples of such may include a program cartridge and cartridge interface (such as that found in video game devices), a removable memory chip (such as an EPROM, or PROM) and associated socket, and other removable storage units 1822 and interfaces 1820 which allow software and data to be transferred from the removable storage unit 1822 to computer system 1800.

Computer system 1800 may also include a communications interface 1824. Communications interface 1824 allows software and data to be transferred between computer system 1800 and external devices. Examples of communications interface 1824 may include a modem, a network interface (such as an Ethernet card), a communications port, a PCMCIA slot and card, a wireless LAN (local area network) interface, etc. Software and data transferred via communications interface 1824 are in the form of signals 1828 which may be electronic, electromagnetic, optical, or other signals capable of being received by communications interface 1824. These signals 1828 are provided to communications interface 1824 via a communications path (i.e., channel) 1826. This channel 1826 carries signals 1828 and may be implemented using wire or cable, fiber optics, a phone line, a cellular phone link, a wireless link, and other communications channels.

In this document, the term "computer program product" refers to removable storage units 1816, 1822, and signals 1828. These computer program products are means for providing software to computer system 1800. The invention is directed to such computer program products.

Computer programs (also called computer control logic) are stored in main memory 1808, and/or secondary memory 1810 and/or in computer program products. Computer programs may also be received via communications interface 1824. Such computer programs, when executed, enable the computer system 1800 to perform the features of the present invention as discussed herein. In particular, the computer programs, when executed, enable the processor 1804 to perform the features of the present invention. Accordingly, such computer programs represent controllers of the computer system 1800.

In an embodiment where the invention is implemented using software, the software may be stored in a computer program product and loaded into computer system 1800 using hard drive 182, removable storage drive 1814, interface 1820 or communications interface 1824. The control logic (software), when executed by the processor 1804, causes the processor 1804 to perform the functions of the invention as described herein.

In another embodiment, the invention is implemented primarily in hardware using, for example, hardware components such as application specific integrated circuits (ASICs). Implementation of hardware state machine(s) so as to perform the functions described herein will be apparent to persons skilled in the relevant art(s). In yet another embodiment, the invention is implemented using a combination of both hardware and software.

D. Conclusion

While various embodiments of the present invention have been described above, it should be understood that they have been presented by way of example only, and not limitation. It will be understood by those skilled in the art that various changes in form and details may be made therein without departing from the spirit and scope of the invention as defined in the appended claims. Accordingly, the breadth and scope of the present invention should not be limited by any of the above-described exemplary embodiments, but should be defined only in accordance with the following claims and their equivalents.

What is claimed is:

1. A method for transmitting a packet of information in an upstream channel of a communications system, comprising:
    organizing the packet into an information segment;
    encoding the information segment in accordance with an error correcting code to generate a parity segment;
    dividing the information segment and the parity segment into a plurality of transmission segments; and
    separately transmitting the plurality of transmission segments over the upstream channel of the communications system.

2. The method of claim 1, further comprising:
    receiving the packet for transmission.

3. The method of claim 1, further comprising:
    receiving the packet in a cable modem for transmission over the upstream channel to a cable modem termination system (CMTS).

4. The method of claim 1, wherein the organizing comprises:
    identifying the packet by a single information segment to organize the packet.

5. The method of claim 1, wherein the organizing comprises:
    fragmenting the packet into a plurality of parts corresponding to the information segment to organize the packet; and further comprising;
    identifying each part from among the plurality of parts as belonging to the information segment.

6. The method of claim 1, wherein the packet is from among a plurality of packets, and wherein the organizing comprises:
    organizing the plurality of packets into a plurality of information segments, and wherein the encoding comprises:
    arranging the plurality of information segments as a plurality of rows and a plurality of columns to form a matrix; and
    performing a parity checking operation on the plurality of rows to generate the parity segment.

7. The method of claim 1, wherein the encoding comprises:
    encoding the information segment in accordance with a Hamming code or an exclusive or (XOR) code.

8. The method of claim 1, further comprising:
    adding identification bits to the information segment and to the parity segment to indicate the information segment and the parity segment belong to a unique group of encoded segments.

9. The method of claim 1, further comprising:
    adapting the information segment and the parity segment for transmission over the upstream channel via a physical layer (PHY) of a cable modem.

10. The method of claim 9, wherein the adapting comprises:
    adapting the information segment to provide a first transmission segment from among the plurality of transmission segments; and
    adapting the parity segment to provide a second transmission segment from among the plurality of transmission segments.

11. The method of claim 9, wherein the adapting comprises:
    prepending a media access control (MAC) header to the information segment and to the parity segment;
    Forward Error Correction (FEC) encoding the MAC header, the information segment, and the parity segment; and
    prepending a preamble to the MAC header, the information segment, and the parity segment.

12. The method of claim 11, wherein the adapting further comprises:
    interleaving the preamble, the MAC header, the information segment, and the parity segment.

13. The method of claim 1, wherein the separately transmitting comprises:
    separately transmitting the plurality of transmission segments over a wireless upstream channel of the communications system.

14. A device for transmitting packets in an upstream channel of a communications system, comprising:
    a media access control (MAC) block configured to organize a packet into an information segment and to encode the information segment in accordance with an error correcting code to generate a parity segment;
    a physical layer (PHY) logic block configured to divide the information segment and the parity segment into a plurality of transmission segments; and
    a transmitter configured to separately transmit the plurality of transmission segments over the upstream channel of the communications system.

15. The device of claim 14, wherein the MAC block is configured to receive the packet for transmission.

16. The device of claim 15, wherein the MAC block is further configured to receive the packet in a cable modem for transmission over the upstream channel to a cable modem termination system (CMTS).

17. The device of claim 14, wherein the MAC block is configured to identify the packet by a single information segment to organize the packet.

18. The device of claim 14, wherein the MAC block is further configured to fragment the packet into a plurality of parts corresponding to the information segment to organize the packet, and to identify each part from among the plurality of parts as belonging to the information segment.

19. The device of claim 14, wherein the packet is from among a plurality of packets, and wherein the MAC block, is further configured to organize the plurality of packets into a plurality of information segments, to arrange the plurality of information segments as a plurality of rows and a plurality of columns to form a matrix, and to perform a parity checking operation on the plurality of rows to generate the parity segment.

20. The device of claim 14, wherein the MAC block is further configured to encode the information segment in accordance with a Hamming code or an exclusive or (XOR) code.

21. The device of claim 14, wherein the MAC block is further configured to add identification bits to the information segment and to the parity segment to indicate
the information segment and the parity segment belong to a unique group of encoded segments.

22. The device of claim 14, wherein the PHY logic block is further configured to adapt the information segment and the parity segment for transmission over the upstream channel via a PHY.

23. The device of claim 22, wherein the PHY logic block is further configured to adapt the information segment to provide a first transmission segment from among the plurality of transmission segments, and to adapt the parity segment to provide a second transmission segment from among the plurality of transmission segments.

24. The device of claim 22, wherein the MAC block is further configured to prepend a MAC header to the information segment and to the parity segment, to Forward Error Correction (FEC) encode the MAC header, the information segment, and the parity segment, and to propend a preamble to the MAC header, the information segment, and the parity segment.

25. The device of claim 24, wherein the PHY logic block is further configured to interleave the preamble, the MAC header, the information segment, and the parity segment.

26. The device of claim 14, wherein the upstream channel of the communications system comprises:
a wireless upstream channel.

27. A method for receiving a packet in an upstream channel, comprising:
receiving a plurality of transmission segments from over the upstream channel each transmission segment from among the plurality of transmission segments including an information segment and a parity segment;
identifying a transmission segment from among the plurality of transmission segments that includes an error as a bad segment;
decoding transmission segments not identified as the bad segment in accordance with an error correcting code to correct the error; and
reconstructing the packet from the plurality of transmission segments.

28. The method of claim 27, wherein the receiving comprises:
receiving the plurality of transmission segments from a wireless upstream channel of a communications system.

29. The method of claim 27, further comprising:
receiving the plurality of transmission segments in a cable modem termination system (CMTS) over the upstream channel from a cable modem.

30. The method of claim 27, wherein the identifying comprises:
marking the transmission segment from among the plurality of transmission segments that includes the error as the bad segment.

31. The method of claim 27, wherein the transmission segment includes a burst preamble, and wherein the identifying comprises:
identifying the transmission segment as the bad segment when the error is included in the burst preamble.

32. The method of claim 27, further comprising:
Forward Error Correction(FEC) decoding the information segment and the parity segment in accordance with the error correcting code.

33. The method of claim 32, wherein the FEC decoding comprises:
FEC decoding the information segment and the parity segment in accordance with a Hamming code or an exclusive or (XOR) code.

34. The method of claim 27, wherein the identifying comprises:
identifying the transmission segment as the bad segment when the transmission segment includes more errors than can be corrected by the error correcting code.

35. The method of claim 27, further comprising:
recovering the information segment and the parity segment from the plurality of transmission segments.

36. The method of claim 27, further comprising:
reassembling the information segment and the parity segment as a plurality of rows and a plurality of columns to form a matrix.

37. The method of claim 36, wherein the decoding comprises:
decoding the plurality of rows.

38. The method of claim 36, further comprising:
Forward Error Correction (FEC) decoding the plurality of columns in accordance with a second error correcting code.

39. The method of claim 27, wherein the reconstructing comprises:
concatenating the plurality of transmission segments to reconstruct the packet.

40. A device, comprising:
a receiver configured to receive a packet as a plurality of transmission segments over an upstream channel, the plurality of transmission segments including an information segment and a parity segment;
a physical layer (PHY) logic block configured to identify a transmission segment from among the plurality of transmission segments that includes an error as a had segment; and
a media access control (MAC) block configured to decode transmission segments not identified as the bad segment in accordance with an error correcting code to correct the error and to reconstruct the packet from the plurality of transmission segments.

41. The device of claim 40, wherein the receiver is configured to receive the plurality of transmission segments from a wireless upstream channel of a communications system.

42. The device of claim 40, wherein the receiver is further configured to receive the plurality of transmission segments in a cable modem termination system (CMTS) over the upstream channel from a cable modem.

43. The device of claim 40, wherein the PHY logic block is configured to mark the transmission segment from among the plurality of transmission segments that includes the error as the bad segment.

44. The device of claim 40, wherein the transmission segment includes a burst preamble, and wherein the PHY logic block is further configured to identify the transmission segment as the bad segment when the error is included in the burst preamble.

45. The device of claim 40, wherein the receiver is further configured to Forward Error Correction (FEC) decode the information segment and the parity segment in accordance with the error correcting code.

46. The device of claim 45, wherein the receiver is further configured to FEC decode the information segment and the parity segment in accordance with a Hamming code or an exclusive or (XOR) code.

47. The device of claim 40, wherein the PHY logic block is further configured to identify the transmission segment as the bad segment when the transmission segment includes more errors than can be corrected by the error correcting code.

48. The device of claim 40, wherein the receiver is configured to recover the information segment and the parity segment from the plurality of transmission segments.

49. The device of claim 40, wherein the MAC block is further configured to reassemble the information segment and the parity segment as a plurality of rows and a plurality of columns to form a matrix.

50. The device of claim 40, wherein the MAC block is further configured to decode the plurality of rows.

51. The method of claim 1, further comprising:
adding identification bits to the information segment and to the parity segment to indicate an encoding order.

52. The device of claim 14, wherein the MAC block is further configured to add identification bits to the information segment and to the parity segment to indicate an encoding order.

53. The device of claim 49, wherein the MAC block is further configured to Forward Error Correction (FEC) decode the plurality of columns in accordance with a second error correcting code.

54. The device of claim 40, wherein the MAC block is further configured to concatenate the plurality of transmission segments to reconstruct the packet.

* * * * *

UNITED STATES PATENT AND TRADEMARK OFFICE
CERTIFICATE OF CORRECTION

| | | |
|---|---|---|
| PATENT NO. | : 8,667,362 B2 | Page 1 of 1 |
| APPLICATION NO. | : 12/488124 | |
| DATED | : March 4, 2014 | |
| INVENTOR(S) | : Currivan et al. | |

It is certified that error appears in the above-identified patent and that said Letters Patent is hereby corrected as shown below:

In the Claims

In column 25, line 29, please delete "to propend a preamble" and insert -- to prepend a preamble --.

In column 26, line 43, please replace "as a had" with -- as a bad --.

Signed and Sealed this
Thirty-first Day of March, 2015

Michelle K. Lee
*Director of the United States Patent and Trademark Office*